(12) United States Patent
Lee

(10) Patent No.: US 11,758,725 B2
(45) Date of Patent: Sep. 12, 2023

(54) MEMORY DEVICE AND MANUFACTURING METHOD THEREOF

(71) Applicant: SK hynix Inc., Icheon-si (KR)

(72) Inventor: Nam Jae Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 283 days.

(21) Appl. No.: 17/204,416

(22) Filed: Mar. 17, 2021

(65) Prior Publication Data

US 2022/0093637 A1    Mar. 24, 2022

(30) Foreign Application Priority Data

Sep. 18, 2020  (KR) .................. 10-2020-0120330

(51) Int. Cl.

| | |
|---|---|
| *H10B 43/27* | (2023.01) |
| *H01L 23/00* | (2006.01) |
| *H10B 41/10* | (2023.01) |
| *H10B 41/27* | (2023.01) |
| *H10B 41/40* | (2023.01) |
| *H10B 43/10* | (2023.01) |
| *H10B 43/40* | (2023.01) |

(52) U.S. Cl.
CPC ............. *H10B 43/27* (2023.02); *H01L 24/06* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/10; H10B 41/40; H10B 43/40; H10B 41/27; H10B 42/06
See application file for complete search history.

(56) References Cited

U.S. PATENT DOCUMENTS

| | | | |
|---|---|---|---|
| 9,524,903 B2 | 12/2016 | Lee | |
| 10,600,781 B1* | 3/2020 | Xiao | ................ G11C 5/06 |
| 10,790,296 B1* | 9/2020 | Yamaha | ............. H10B 41/30 |
| 11,211,392 B1* | 12/2021 | Puthenthermadam | ................ |
| | | | G11C 16/08 |
| 2016/0027730 A1 | 1/2016 | Lee | |
| 2019/0081069 A1 | 3/2019 | Lu et al. | |
| 2019/0115358 A1 | 4/2019 | Lee et al. | |
| 2019/0378857 A1 | 12/2019 | Lee | |
| 2019/0393240 A1* | 12/2019 | Kim | ............ H10B 43/40 |

(Continued)

*Primary Examiner* — Nathan W Ha
(74) *Attorney, Agent, or Firm* — WILLIAM PARK & ASSOCIATES LTD.

(57) ABSTRACT

A memory device and a respective manufacturing method are set forth, wherein the memory device includes: a peripheral circuit layer including a plurality of conductive pads; a bonding structure disposed on the peripheral circuit layer; a cell stack structure disposed on the bonding structure, the cell stack structure including a plurality of gate conductive patterns; and a plurality of vertical gate contact structures respectively connecting the plurality of conductive pads and the plurality of gate conductive patterns while penetrating the bonding structure, wherein each of the plurality of gate conductive patterns includes a first horizontal part and a second horizontal part, which extend horizontally from a cell region to a contact region, and a third horizontal part connected to one end of the first horizontal part and one end of the second horizontal part, the third horizontal part being connected to a corresponding gate contact structure.

19 Claims, 28 Drawing Sheets

(56) References Cited

U.S. PATENT DOCUMENTS

| | | | |
|---|---|---|---|
| 2020/0091071 A1* | 3/2020 | Lee | H01L 21/76832 |
| 2020/0091185 A1* | 3/2020 | Baek | H10B 43/50 |
| 2020/0152654 A1* | 5/2020 | Hwang | H10B 41/30 |
| 2020/0176464 A1* | 6/2020 | Jang | H01L 21/76805 |
| 2020/0185405 A1* | 6/2020 | Cui | H01L 29/1037 |
| 2020/0303401 A1* | 9/2020 | Kanamori | H01L 29/1037 |
| 2021/0210426 A1* | 7/2021 | Lee | H10B 43/27 |
| 2021/0296337 A1* | 9/2021 | Hagishima | H10B 43/27 |
| 2021/0313281 A1* | 10/2021 | Kaminaga | H10B 43/10 |
| 2021/0375913 A1* | 12/2021 | Zhang | H10B 43/35 |
| 2021/0399018 A1* | 12/2021 | Zhu | H10B 43/50 |
| 2021/0408033 A1* | 12/2021 | Baraskar | H01L 25/0657 |
| 2022/0005825 A1* | 1/2022 | Zhang | H10B 43/10 |
| 2022/0037352 A1* | 2/2022 | Zhang | H10B 41/27 |
| 2022/0068956 A1* | 3/2022 | Clampitt | H10B 43/27 |
| 2022/0068957 A1* | 3/2022 | Yeh | H10B 43/27 |

* cited by examiner

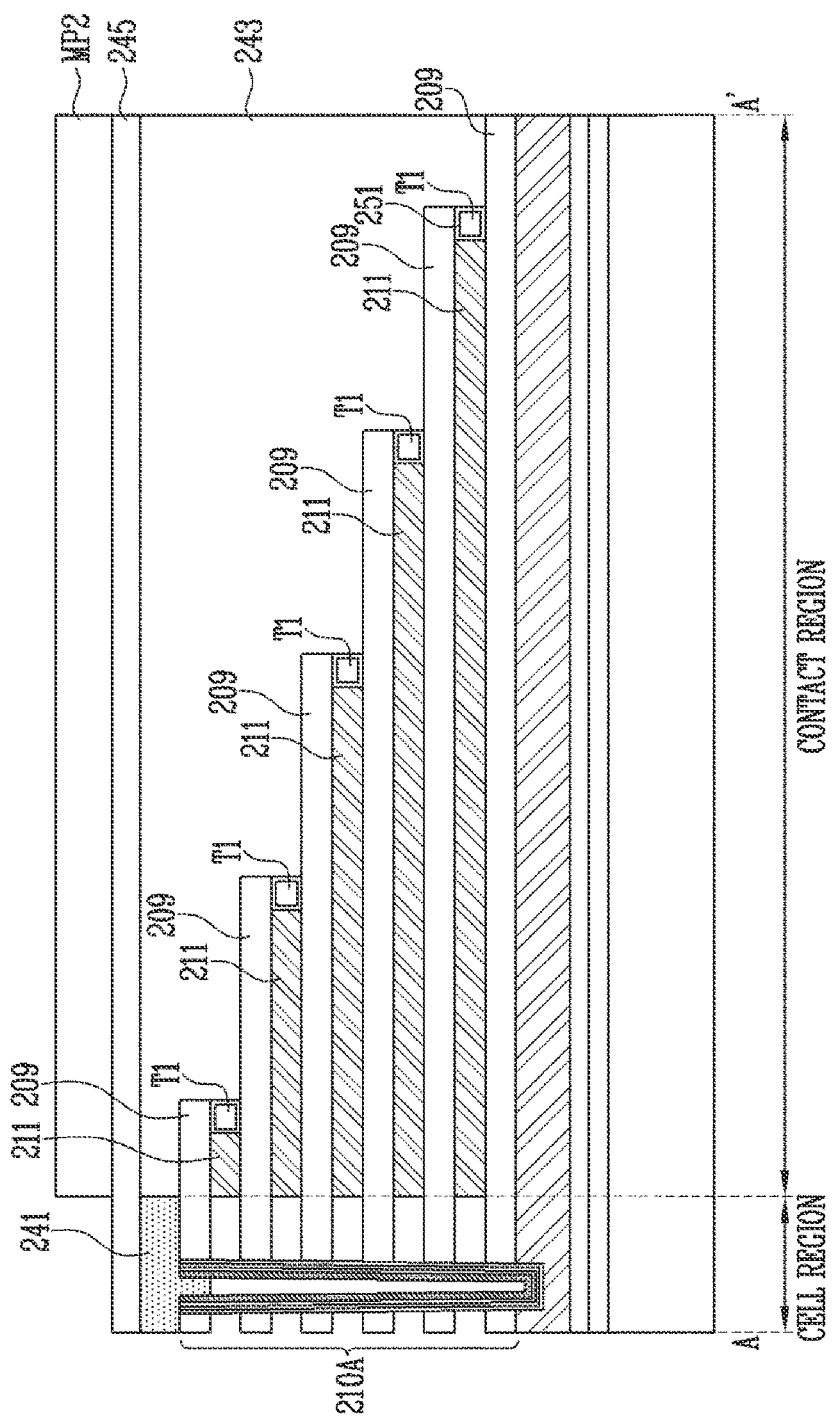

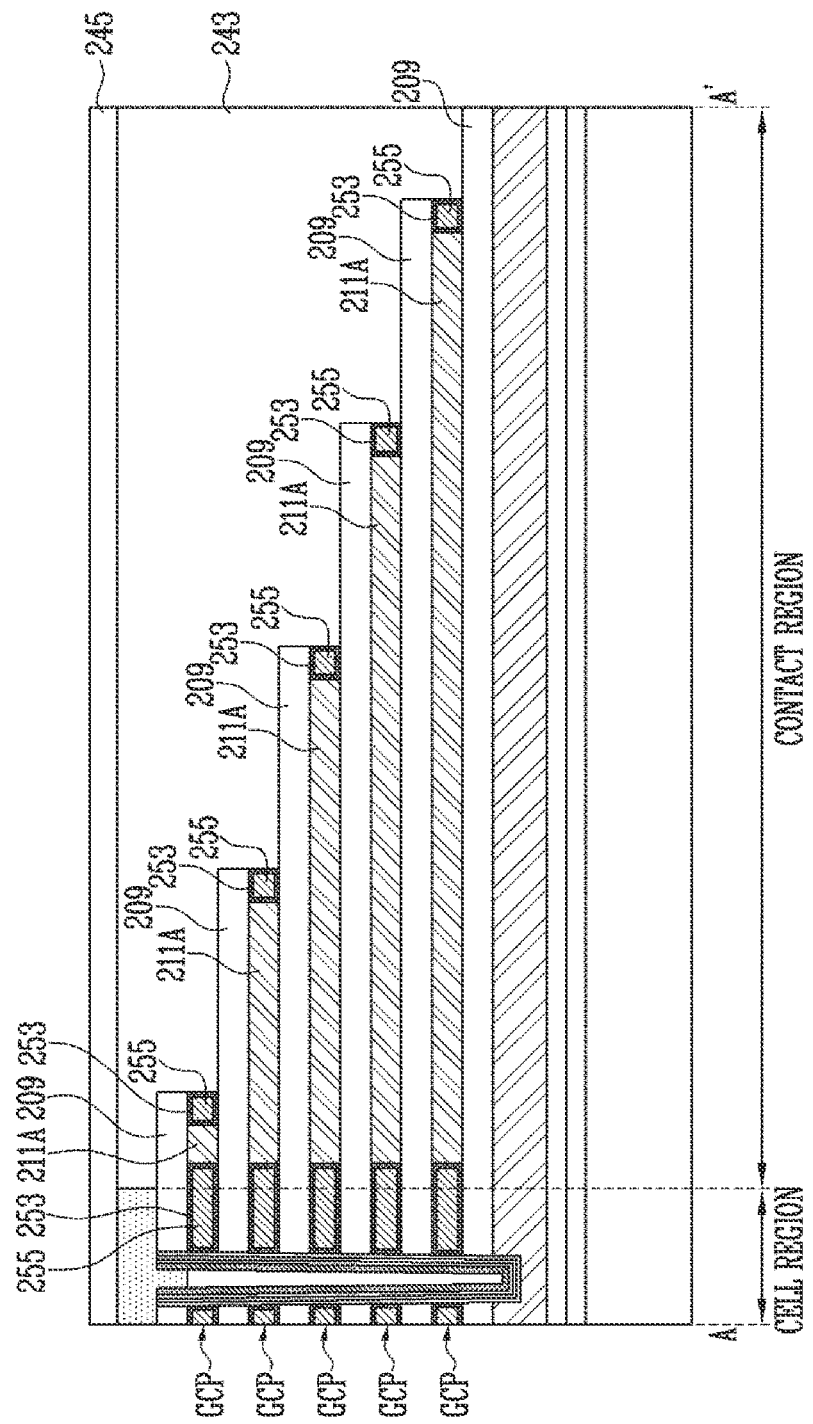

MEMORY DEVICE AND MANUFACTURING METHOD THEREOF

CROSS-REFERENCE TO RELATED APPLICATION

The present application claims priority under 35 U.S.C. § 119(a) to Korean patent application number 10-2020-0120330, filed on Sep. 18, 2020, in the Korean Intellectual Property Office, the entire disclosure of which is incorporated herein by reference.

BACKGROUND

1. Technical Field

The present disclosure generally relates to a memory device and a manufacturing method thereof, and more particularly, to a three-dimensional memory device and a manufacturing method thereof.

Related Art

A memory device may include a memory cell array and a peripheral circuit connected to the memory cell array. The memory cell array may include a plurality of memory cells capable of storing data, and the peripheral circuit may be configured to perform a general operation such as a program operation, a read operation, or an erase operation.

In order to improve the degree of integration of the memory device, the memory cell array may include memory cells three-dimensionally arranged above the peripheral circuit.

SUMMARY

Embodiments provide a memory device capable of improving operational reliability and a manufacturing method of the memory device.

In accordance with an aspect of the present disclosure, a memory device may include: a first gate conductive pattern disposed to extend horizontally on a cell region and a contact region, the first gate conductive pattern including a first horizontal part and a second horizontal part, which extend in parallel to each other to the contact region, and a third horizontal part connected to one end portion of the first horizontal part and one end portion of the second horizontal part; a first insulating pattern disposed between the first horizontal part and the second horizontal part of the first gate conductive pattern; a second gate conductive pattern disposed in parallel to the first gate conductive pattern under the first gate conductive pattern, the second gate conductive pattern including a fourth horizontal part and a fifth horizontal part, which extend in parallel to each other to the contact region, and a sixth horizontal part connected to one end portion of the fourth horizontal part and one end portion of the fifth horizontal part; a first gate contact structure extending vertically on the contact region, the first gate contact structure being in contact with the first gate conductive pattern while penetrating the third horizontal part of the first gate conductive pattern; and a second gate contact structure extending vertically on the contact region, the second gate contact structure being in contact with the second gate conductive pattern while penetrating the first insulating pattern and penetrating the sixth horizontal part of the second gate conductive pattern.

In accordance with another aspect of the present disclosure, a memory device may include: a peripheral circuit layer including a plurality of conductive pads; a bonding structure disposed on the peripheral circuit layer; a cell stack structure disposed on the bonding structure, the cell stack structure including a plurality of gate conductive patterns; and a plurality of gate contact structures respectively connecting the plurality of conductive pads and the plurality of gate conductive patterns while penetrating the bonding structure, wherein each of the plurality of gate conductive patterns includes a first horizontal part and a second horizontal part, which extend horizontally from a cell region to a contact region, and a third horizontal part connected to one end of the first horizontal part and one end of the second horizontal part, the third horizontal part being connected to a corresponding gate contact structure among the plurality of gate contact structures.

In accordance with still another aspect of the present disclosure, a method of manufacturing a memory device may include: forming a cell stack structure by forming a stepped structure including interlayer insulating layers stacked to be spaced apart from each other while surrounding a channel structure and sacrificial layers surrounding the channel structure between the interlayer insulating layers on a sacrificial substrate including a cell region and a contact region; forming gaps in sidewalls of the interlayer insulating layers by etching sidewalls of the sacrificial layers such that the interlayer insulating layers protrude farther than the sacrificial layers; forming a first tunnel extending in a first direction in the sidewall of each of the sacrificial layers by forming a gap fill insulating layer on the entire structure including the stepped structure; exposing the sidewalls of the sacrificial layers and the first tunnel by performing a slit process of etching the gap fill insulating layer and the stepped structure in a second direction perpendicular to the first direction; forming second tunnels by selectively removing the sacrificial layers of the cell region and etching sidewalls of the sacrificial layers of the contact region to a predetermined thickness, wherein the second tunnels are respectively connected to both end portions of the first tunnel and extend in the second direction; and forming gate conductive patterns by filling, with a conductive material, a region in which the sacrificial layers on the cell region are removed and the inside of the first tunnel and the second tunnels on the contact region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIGS. 5 to 9, 10A, 10B, 11A, 11B, 12, 13A, 13B, 14A, and 14B are views illustrating a method of forming a cell stack structure in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Figure 1:
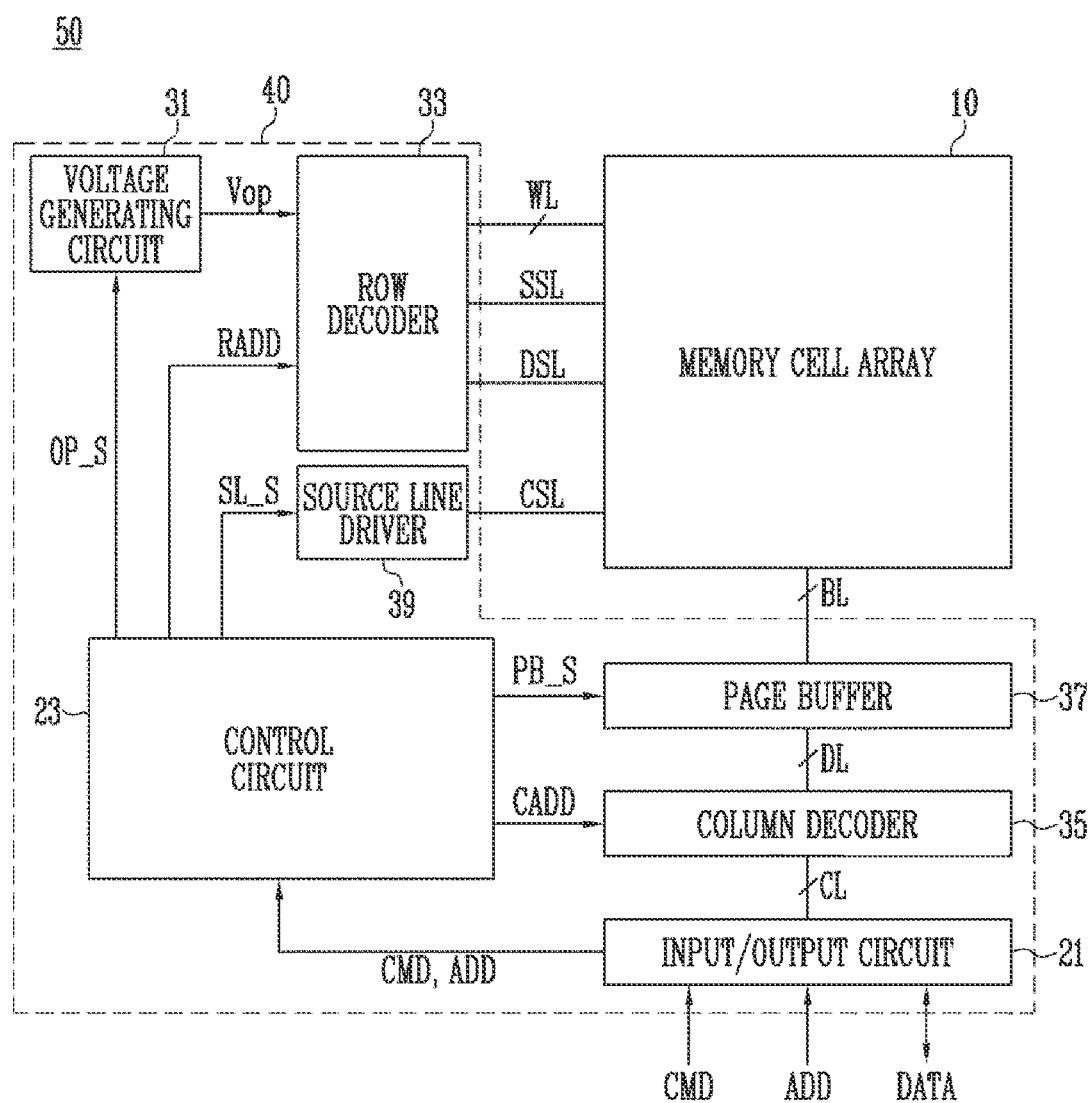
FIG. 1 is a block diagram illustrating a memory device in accordance with an embodiment of the present disclosure.

FIG. 1 is a block diagram illustrating a memory device in accordance with an embodiment of the present disclosure.

Referring to FIG. 1, the memory device 50 may include a peripheral circuit 40 and a memory cell array 10.

The peripheral circuit 40 may be configured to perform a general operation such as a program operation for storing data in the memory cell array 10, a read operation for outputting data stored in the memory cell array 10, or an erase operation for erasing data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may include one or more cell strings. Each of the cell strings may include at least one drain select transistor, a plurality of memory cells, and at least one source select transistor, which are connected between any one of bit lines BL and a common source line CSL. The at least one drain select transistor may be connected to a drain select line DSL, the plurality of memory cells may be connected to a plurality of word lines WL, and the at least one source select transistor may be connected to a source select line SSL.

The input/output circuit 21 may transfer, to the control circuit 23, a command CMD and an address ADD, which are transferred from an external device (e.g., a memory controller) of the memory device 50. The input/output circuit 21 may transmit data DATA received from the external device to the column decoder 35 or output data DATA received from the column decoder 35 to the external device.

The control logic 23 may control the voltage generating circuit 31, the row decoder 33, the column decoder 35, the page buffer 37, and the source line driver 39 to perform a program operation, a read operation, or an erase operation in response to the command CMD and the address ADD, which may be received through the input/output circuit 21. For example, the control circuit 23 may generate and output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may selectively transfer the operating voltages Vop generated by the voltage generating circuit 31 to the drain select line DSL, the word lines WL, and the source select line SSL in response to the row address RADD. Also, the row decoder 33 may selectively discharge voltages of the drain select line DSL, the word lines WL, and the source select line SSL.

The column decoder 35 may transmit data DATA input from the input/output circuit 21 to the page buffer 37 or transmit data DATA stored in the page buffer 37 to the input/output circuit 21 in response to the column address CADD. For example, in a program operation, the column decoder 35 may transmit data DATA received from the input/output circuit 21 through column lines CL to the page buffer 37 in response to the column address CADD. In a read operation, the column decoder 35 may receive data DATA stored in the page buffer 37 through data lines DL, and transmit the received data DATA to the input/output circuit 21.

In a program operation, the page buffer 37 may temporarily store data DATA received from the column decoder 35, and control a potential of the bit lines BL, based on the temporarily stored data DATA. In a read operation, the page buffer 37 may sense a potential or current amount of the bit lines BL, and latch data DATA, based on a sensing result. The page buffer 37 may operate in response to the page buffer control signal PB_S.

The source line driver 39 lay control a voltage applied to the common source line CSL in response to the source line control signal SL_S. For example, in an erase operation, the source line driver 39 may apply an erase operation to the common source line CSL.

In order to improve the degree of integration of the memory device, a cell stack structure of the memory cell array 10 may overlap with a peripheral circuit layer including the peripheral circuit 40. For example, the cell stack structure may be bonded onto the peripheral circuit layer.

Figure 2A:
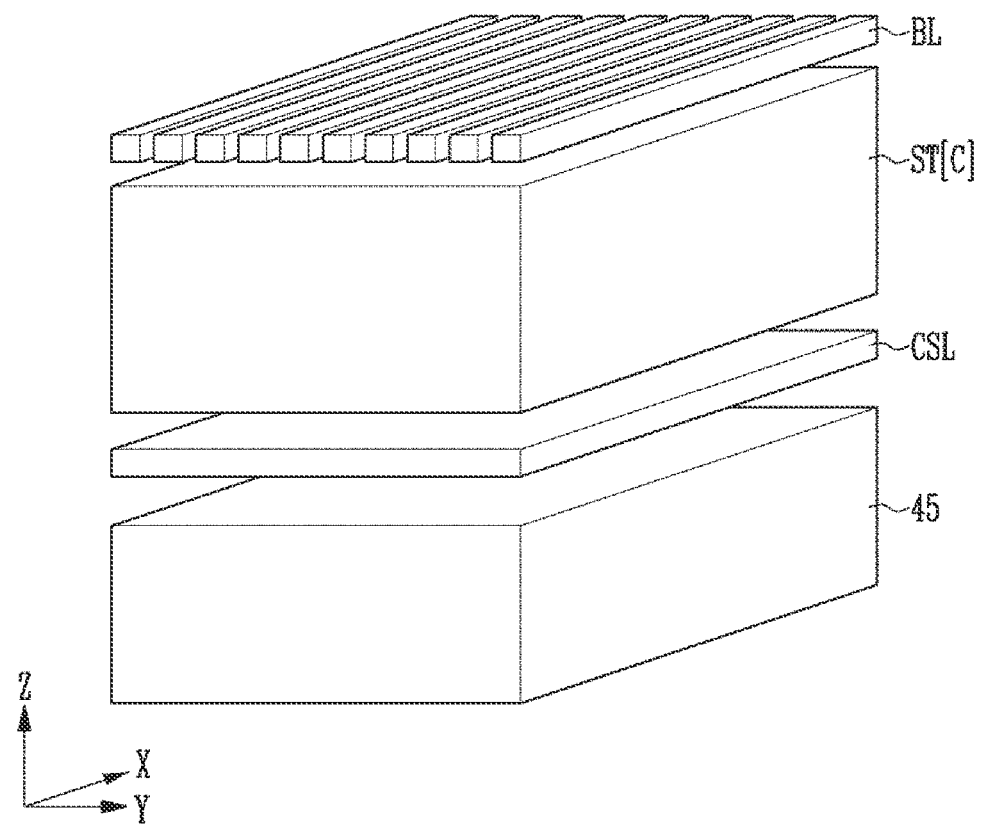
FIGS. 2A and 2B are perspective views illustrating overlapping structures of a peripheral circuit layer and a cell stack structure in accordance with embodiments of the present disclosure.

FIGS. 2A and 23 are perspective views illustrating overlapping structures of a peripheral circuit layer and a cell stack structure in accordance with embodiments of the present disclosure.

Referring to FIGS. 2A and 23, a common source line CSL and a plurality of bit lines BL may overlap with each other above the peripheral circuit layer 45. The cell stack structure ST[C] may be disposed between the common source line CSL and the plurality of bit lines BL.

Referring to FIG. 2A, in an embodiment, the common source line CSL may be disposed between the cell stack structure ST[C] and the peripheral circuit layer 45, and the bit lines BL may overlap with the common source line CSL with the cell stack structure ST[C] interposed therebetween.

Figure 2B:
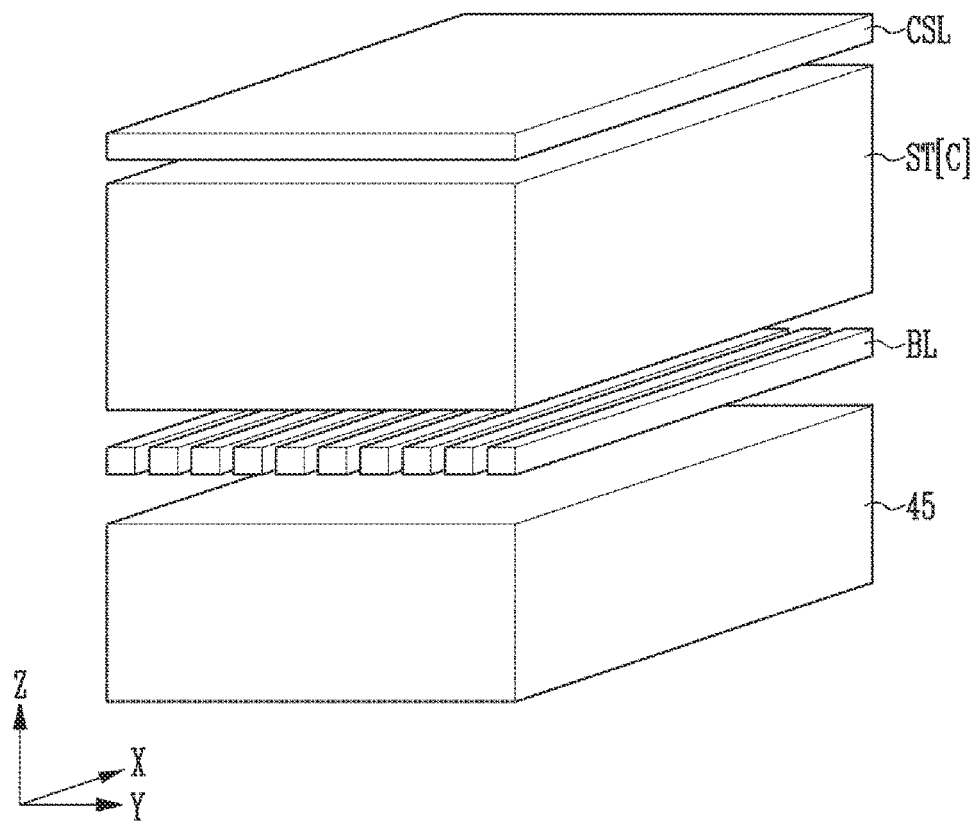

Referring to FIG. 2B, in an embodiment, the bit lines BL may be disposed between the cell stack structure ST[C] and the peripheral circuit layer 45. The common source line CSL may overlap with the bit lines BL with the cell stack structure ST[C] interposed therebetween.

In the above-described embodiments of the present disclosure, it is illustrated that the whole of the cell stack structure ST[C] overlaps with the top of the peripheral circuit layer 45. However, only a partial region of the cell stack structure ST[C] may overlap with the top of the peripheral circuit layer 45, That is, a partial region of the cell stack structure ST[C] and a partial region of the peripheral circuit layer 45 may overlap with each other.

Figure 3:
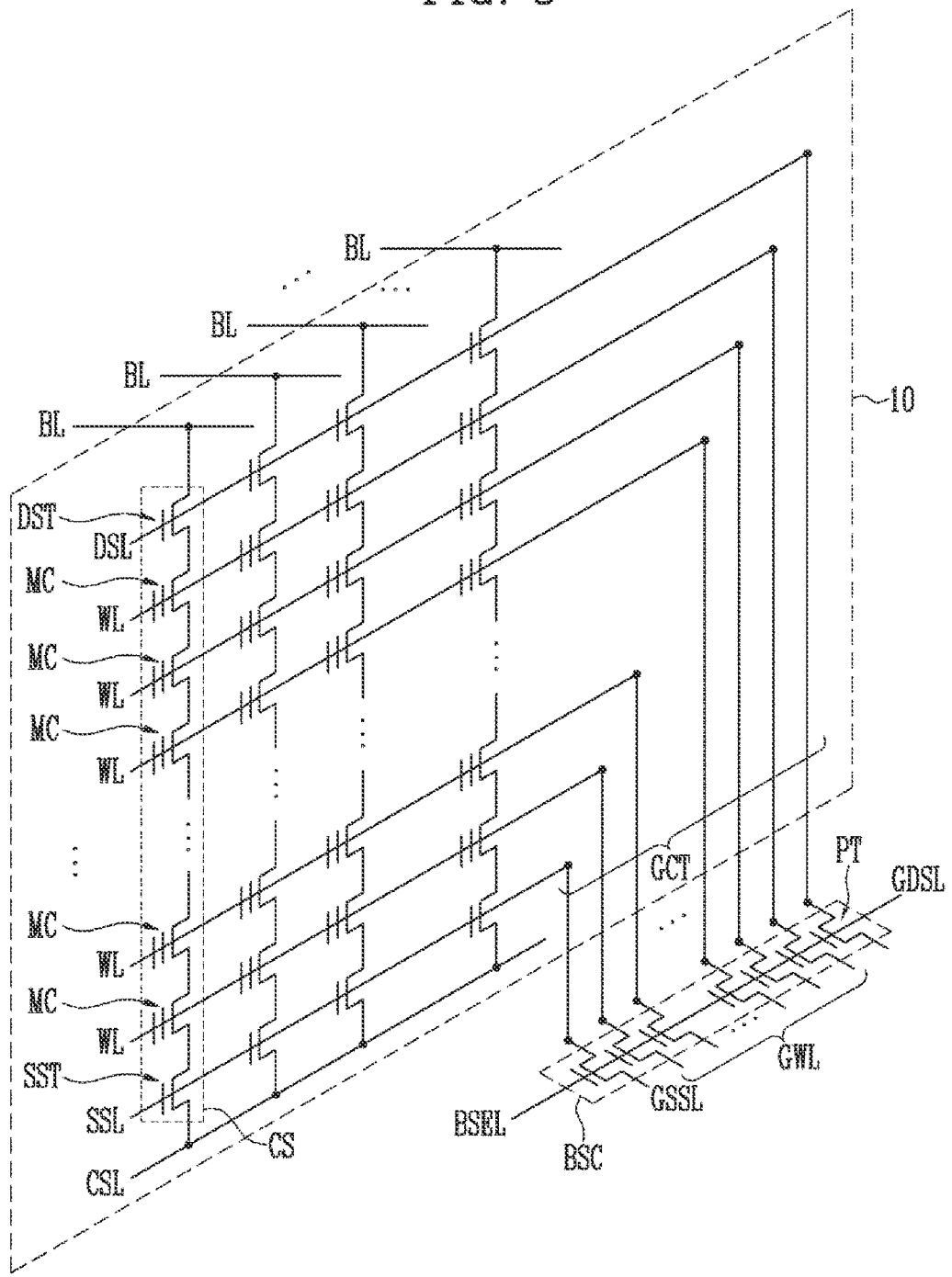
FIG. 3 is a circuit diagram illustrating a memory cell array and a row decoder in accordance with an embodiment of the present disclosure.

FIG. 3 is a circuit diagram illustrating a memory cell array and a row decoder in accordance with an embodiment of the present disclosure.

Referring to FIG. 3, the memory cell array 10 may include a plurality of cell strings CS respectively connected to a plurality of bit lines BL. The plurality of cell strings CS may be commonly connected to a common source line CSL.

Each of the cell strings CS may include at least one source select transistor SST, a plurality of memory cells MC, and at least one drain select transistor DST, which are disposed between the common source line CSL and a bit line BL.

The source select transistor SST may control an electrical connection between the cell string CS and the common source line CSL. The drain select transistor DST may control an electrical connection between the cell string CS and the bit line BL.

One source select transistor SST may be disposed between the common source line CSL and the plurality of memory cells MC, or two or more source select transistors connected in series may be disposed between the common source line CSL and the plurality of memory cells MC. One drain select transistor DST may be disposed between the bit line BL and the plurality of memory cells MC, or two or more drain select transistors connected in series may be disposed between the bit line BL and the plurality of memory cells MC.

The plurality of memory cells MC may be respectively connected to word lines WL. An operation of the plurality of memory cells MC may be controlled by cell gate signals applied to the word lines WL. The source select transistor SST may be connected to a source select line SSL. An operation of the source select transistor SST may be controlled by a source gate signal applied to the source select line SSL. The drain select transistor DST may be connected to a drain select line DSL. An operation of the drain select transistor DST may be controlled by a drain gate signal applied to the drain select line DSL.

The source select line SSL, the drain select line DSL, and the word lines WL may be connected to a block select circuit BSC. The block select circuit BSC may be included in the row decoder 33 described with reference to FIG. 1. In an embodiment, the block select circuit BSC may include pass transistors PT respectively connected to the source select line SSL, the drain select line DSL, and the word lines WL. Gates of the pass transistors PT may be connected to a block select line BSEL. The pass transistors PT may transfer operating voltages applied to global lines GSSL, GWL, and GDSL to the source select line SSL, the drain select line DSL, and the word lines WL in response to a block select signal applied to the block select line BSEL.

The block select circuit BSC may be connected to the source select line SSL, the drain select line DSL, and the word lines WL via gate contact structures GCT.

Figure 4A:
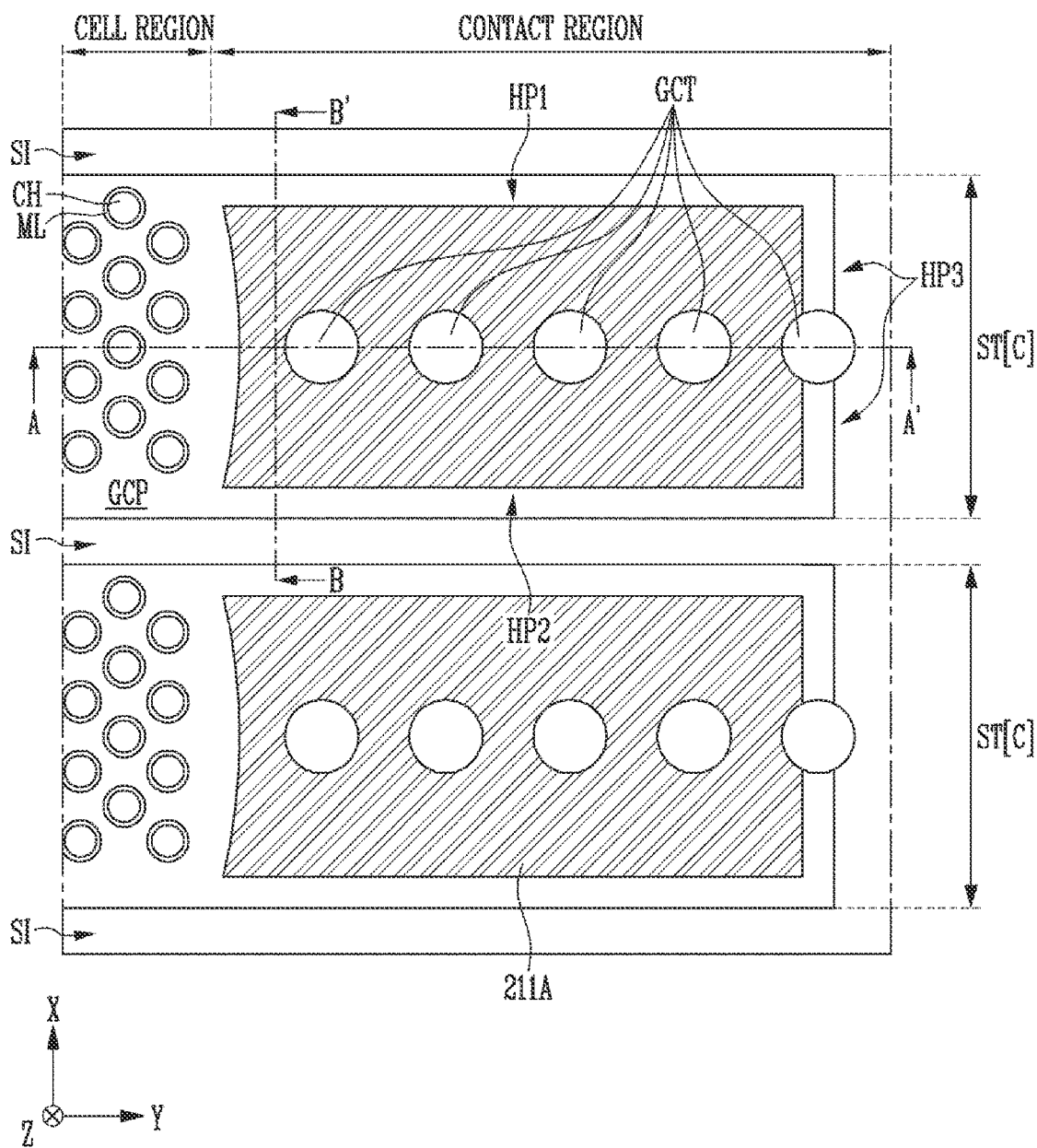
FIG. 4A is a plan view illustrating a cell region and a contact region of a cell stack structure in accordance with an embodiment of the present disclosure.

FIG. 4A is a plan view illustrating a cell region and a contact region of a cell stack structure in accordance with an embodiment of the present disclosure.

Figure 4B:
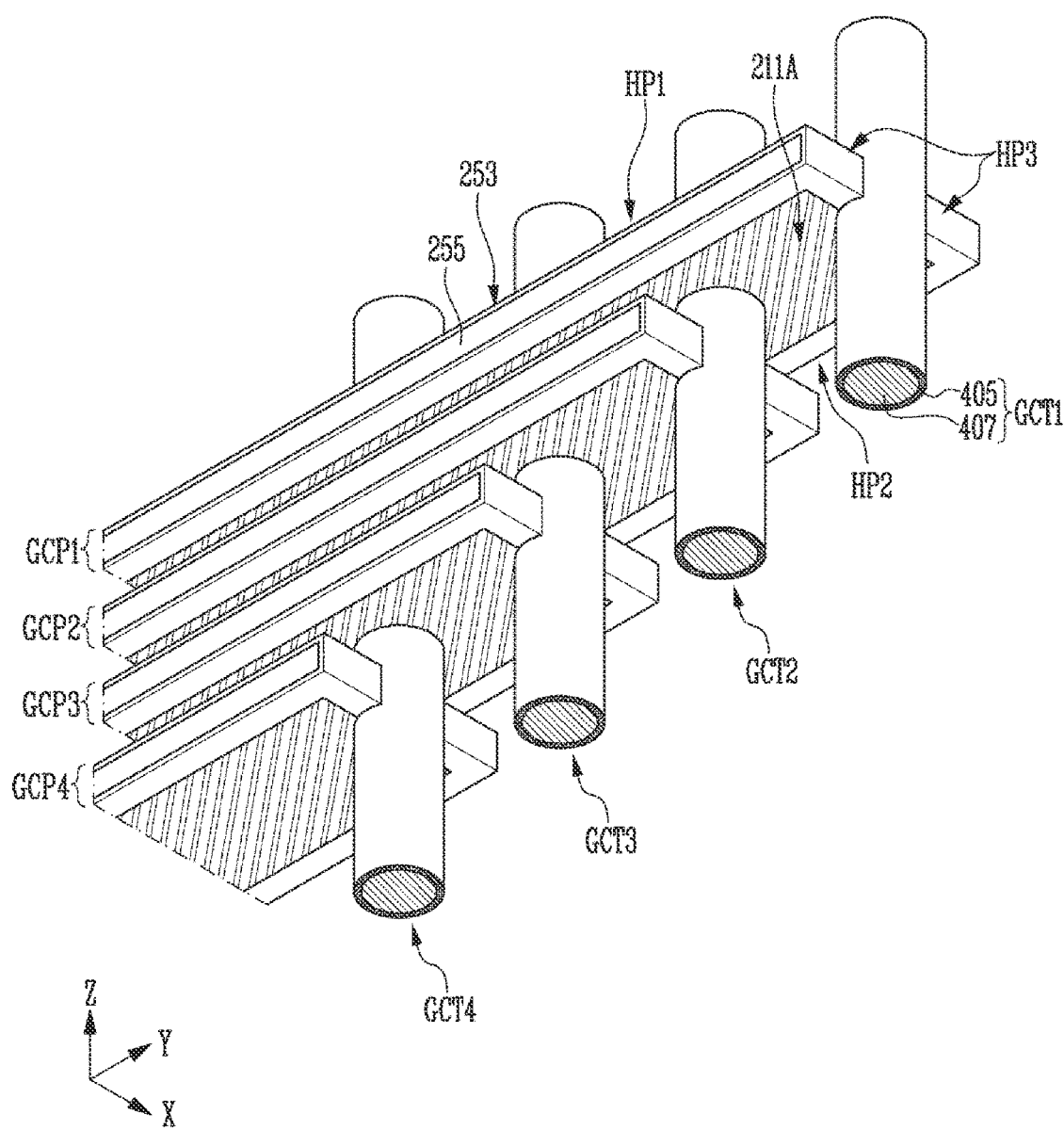
FIG. 4B is a perspective view illustrating a connection structure of gate contact structures and gate conductive patterns in the contact region in accordance with an embodiment of the present disclosure.

FIG. 4B is a perspective view illustrating a connection structure of gate contact structures and gate conductive patterns in the contact region in accordance with an embodiment of the present disclosure.

Referring to FIGS. 4A and 48, cell stack structures ST[C] may be isolated from each other through a slit SI. The cell stack structures ST[C] may include a cell region and a contact region, and the cell region and the contact region may be disposed adjacent to each other.

Each of the cell stack structures ST[C] may include a plurality of gate conductive patterns GCP stacked to be spaced apart from each other in a third direction Z. Each of the cell stack structures ST[C] may surround a channel structure CH extending in the third direction Z.

A sidewall of the channel structure CH may be surrounded by a memory layer ML. The memory layer ML may include a tunnel insulating layer surrounding the channel structure CH, a data storage layer surrounding the tunnel insulating layer, and a blocking insulating layer surrounding the data storage layer. The data storage layer may be formed as a material layer capable of storing data changed using Fowler-Nordheim tunneling. In an embodiment, the data storage layer may be formed as a charge trap nitride layer. The blocking insulating layer may include an oxide layer capable of blocking charges. The tunnel insulating layer may be formed as a silicon oxide layer through which charges may tunnel.

Each of first to fourth gate conductive patterns GCP1, GCP2, GCP3, and GCP4 may extend along a second direction Y. Each of the first to fourth gate conductive patterns GCP1, GCP2, GCP3, and GCP4 may be sequentially arranged along the third direction Z. A stepped structure may be defined by the first to fourth gate conductive patterns GCP1, GCP2, GCP3, and GCP4. For example, the second gate conductive pattern GCP2 may be disposed in parallel to the first gate conductive pattern GCP1 under the first gate conductive pattern GCP1. The third gate conductive pattern GCP3 may be disposed in parallel to the second gate conductive pattern GCP2 under the second gate conductive pattern GCP2. The fourth gate conductive pattern GCP4 may be disposed in parallel to the third gate conductive pattern GCP3 under the third gate conductive pattern GCP3. An extending length of the first gate conductive pattern GCP1 may be longer than that of the second gate conductive pattern GCP2. The extending length of the second gate conductive pattern GCP2 may be longer than that of the third gate conductive pattern GCP3. The extending length of the third gate conductive pattern GCP3 may be longer than that of the fourth gate conductive pattern GCP4. That is, among the first to fourth gate conductive patterns GCP1, GCP2, GCP3, and GCP4, a gate conductive pattern located at an upper portion may have an extending length longer than that of a gate conductive pattern located at a lower portion.

As illustrated in FIG. 4B, first to fourth gate conductive patterns GCP1, GCP2, GCP3, and GCP4 may be respectively in contact with first to fourth gate contact structures GCT1, GCT2, GCT3, and GCT4, Each of the first to fourth gate contact structures GCT1, GCT2, GCT3, and GCT4 may include a first horizontal part HP1 and a second horizontal part HP2, which extend to the contact region, and a third horizontal part HP3 extending toward a corresponding gate contact structure among the first to fourth gate contact structures GCT1, GCT2, GCT3, and GCT4 at one end portion of the first horizontal part HP1 and one end portion of the second horizontal part HP2. That is, the third horizontal part HP3 may connect the one end portion of the first horizontal part HP1 and the corresponding gate contact structure (e.g., GCT1), and connect the one end portion of the second horizontal part HP2 and the corresponding gate contact structure (e.g., GCT1). The first horizontal part HP1 and the second horizontal part HP2 may extend in parallel to each other along the second direction Y, The first horizontal part HP1, the second horizontal part HP2, and the third horizontal part HP3 may include a metal layer 255 and a conductive barrier layer 253 surrounding a surface of the metal layer 255, Among the first to fourth gate conductive patterns GCP1, GCP2, GCP3, and GCP4, a length of a first horizontal part HP1 and a second horizontal part HP2 of a gate conductive pattern disposed at an upper portion may be longer than that of a first horizontal part HP1 and a second horizontal part HP2 of a gate conductive pattern disposed at a lower portion. For example, a length of a first horizontal part HP1 and a second horizontal part HP2 of the first gate conductive pattern GCP1 may be longer than that of a first horizontal part HP1 and a second horizontal part HP2 of the second gate conductive pattern GCP2, The length of the first horizontal part HP1 and the second horizontal part HP2 of the second gate conductive pattern GCP2 may be longer than that of a first horizontal part HP1 and a second horizontal part HP2 of the third gate conductive pattern GCP3. The length of the first horizontal part HP1 and the second horizontal part HP2 of the third gate conductive pattern GCP3 may be longer than that of a first horizontal part HP1 and a second horizontal part HP2 of the fourth gate conductive pattern GCP4.

An insulating pattern 211A may be disposed between the first horizontal part HP1 and the second horizontal part HP2 of each of the first to fourth gate conductive patterns GCP1, GGP2, GCP3, and GCP4. The insulating pattern 211A may be disposed in the same layer as a corresponding gate conductive pattern. Some gate contact structures among the first to fourth gate contact structures GCT1, GCT2, GCT3, and GCT4 may extend in the third direction Z while penetrating the insulating pattern 211A.

For example, the first gate contact structure GCT1 corresponding to the first gate conductive pattern GCP1 may extend in the third direction Z while penetrating a third horizontal part HP3 of the first gate conductive pattern GCP1.

The second gate contact structure GCT2 corresponding to the second gate conductive pattern GCP2 may extend in the third direction Z while penetrating a third horizontal part HP3 of the second gate conductive pattern GCP2. The second gate contact structure GCT2 may penetrate an insulating pattern 211A corresponding to the first gate conductive pattern GCP1.

The third gate contact structure GCT3 corresponding to the third gate conductive pattern GCP3 may extend in the third direction Z while penetrating a third horizontal part HP3 of the third gate conductive pattern GCP3. The third gate contact structure GCT3 may penetrate the insulating pattern 211A corresponding to the first gate conductive pattern GCP1 and an insulating pattern 211A corresponding to the second gate conductive pattern GCP2.

The fourth gate contact structure GCT4 corresponding to the fourth gate conductive pattern GCP4 may extend in the third direction Z while penetrating a third horizontal part HP3 of the fourth gate conductive pattern GCP4, The fourth gate contact structure GCT4 may penetrate the insulating pattern 211A corresponding to the first gate conductive pattern GCP1, the insulating pattern 211A corresponding to the second gate conductive pattern GCP2, and an insulating pattern 211A corresponding to the third gate conductive pattern GCP3.

Each of the second to fourth gate contact structures GCT2, GCT3, and GCT4 may extend vertically while penetrating insulating patterns corresponding to a gate conductive pattern disposed upwardly with respect to a corresponding gate conductive pattern.

According to the above-described structure, the first gate contact structure GCT1 may extend vertically while not being in contact with the second to fourth gate conductive patterns GCP2, GCP3, and GCP4. The second gate contact structure GCT2 may extend vertically while not being in contact with the third and fourth conductive patterns GCP3 and GCP4, and may be electrically and physically spaced apart from the first gate conductive pattern GCP1 by the insulating pattern 211A penetrated thereby. The third gate contact structure GCT3 may extend vertically while not being in contact with the fourth gate conductive pattern GCP4, and may be electrically and physically spaced apart from the first and second gate conductive patterns GCP1 and GCP2 by the insulating patterns 211A penetrated thereby. The fourth gate contact structure GCT4 may be electrically and physically spaced apart from the first to third gate conductive patterns GCP1, GCP2, and GCP3 by the insulating patterns 211A penetrated thereby.

The first to fourth gate conductive patterns GCP1, GCP2, GCP3, and GCP4 may correspond respectively to the first to fourth gate contact structures GCT1, GCT2, GCT3, and GCT4, and the first to fourth gate contact structures GCT1, GCT2, GCT3, and GCT4 may be connected respectively to the third horizontal parts HP3 of the first to fourth gate conductive patterns GCP1, GCP2, GCP3, and GCP4. The first to fourth gate contact structures GCT1, GCT2, GCT3, and GCT4 may be disposed to be spaced apart from each other at a constant distance along the second direction Y. Each of the first to fourth gate contact structures GCT1, GCT2, GCT3, and GCT4 may include a conductive structure 407 and a as conductive barrier layer 405 surrounding the conductive structure 407.

Figure 4C:
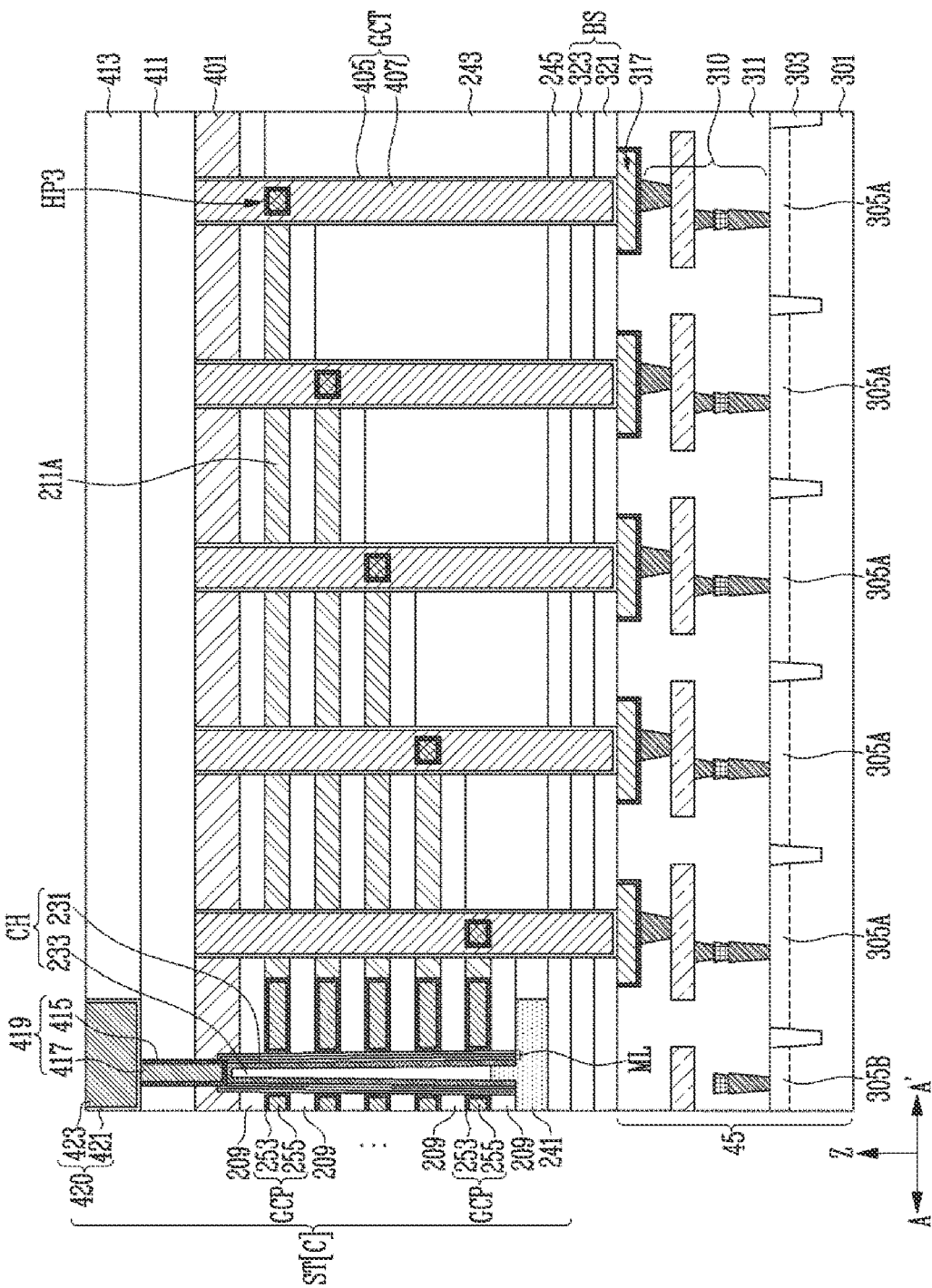
FIG. 4C is a sectional view illustrating a peripheral circuit layer and the cell stack structure in accordance with an embodiment of the present disclosure.

FIG. 4C is a sectional view illustrating a peripheral circuit layer and the cell stack structure in accordance with an embodiment of the present disclosure.

FIG. 4C is a sectional view of a memory device taken along line A-A' shown in FIG. 4A.

Referring to FIG. 4C, the memory device may include a peripheral circuit layer 45, a bonding structure BS disposed on the peripheral circuit layer 45, and a cell stack structure ST[C] disposed on the bonding structure BS. The cell stack structure ST[C] may include a channel structure CH extending vertically. The memory device may further include gate contact structures GCT connecting the peripheral circuit layer 45 and the cell stack structure ST[C] while penetrating the bonding structure BS.

The peripheral circuit layer 45 may include a substrate 301 that includes active regions partitioned by isolation layers 303, interconnection structures 310 disposed on the substrate 301, and conductive pads 317 connected to the interconnection structures 310. The substrate 301 may include a semiconductor substrate such as a silicon substrate or a germanium substrate. Impurity regions 305A and 305B may be defined by doping at least one of a p-type impurity and an n-type impurity into the active regions of the substrate 301. The impurity regions 305A and 305B may include impurity regions 305A used as junction regions of the pass transistors PT shown in FIG. 3. Each of the interconnection structures 310 may include a conductive line, a contact plug, and a contact pad. Each of the conductive pads 317 may include a conductive barrier and a metal layer.

The substrate 301 of the peripheral circuit layer 45 may be covered by an insulating structure 311. The interconnection structures 310 and the conductive pads 317 may be buried in the insulating structure 311. The insulating structure 311 may include multi-layered insulating layers, each including two or more layers.

The bonding structure BS may be disposed on the insulating structure 311 and the conductive pads 317, The bonding structure BS may include a first insulating layer 321 and a second insulating layer 323, which are bonded while facing each other.

In accordance with the present disclosure, the gate contact structures GCT may extend to penetrate the bonding structure BS, and be in contact with the conductive pads 317 of the peripheral circuit layer 45. Accordingly, in the present disclosure, gate conductive patterns CCP of the cell stack structure ST[C] may be electrically connected to the peripheral circuit layer 45 between the peripheral circuit layer 45 and the cell structure ST[C] through the gate contact structures GCT.

The channel structure CH may extend toward the third direction Z, and include a channel layer 231 and a core insulating layer 233. The channel layer 231 may surround a sidewall of the core insulating layer 233.

The channel layer 231 may be used as a channel region of a cell string. The channel layer 231 may include a semiconductor layer. In an embodiment, the channel layer 231 may include silicon. The channel layer 231 may protrude farther toward the peripheral circuit layer 45 than the core insulating layer 233.

The channel layer 231 may be connected to a doped semiconductor layer 241. The doped semiconductor layer 241 may be disposed between the bonding structure BS and the channel structure CH. In an embodiment, the doped semiconductor layer 241 may include an s-type doped silicon layer.

As illustrated in FIG. 4C, an upper conductive layer 420 may overlap with the doped semiconductor layer 241 with the channel structure CH interposed therebetween. The upper conductive layer 420 may include a conductive barrier layer 421 and a conductive pattern 423, The conductive barrier layer 421 may extend along a sidewall and a bottom surface of the conductive pattern 423.

The upper conductive layer 420 may be connected to the channel layer 231 via a channel contact structure 419. The channel contact structure 419 may penetrate a memory layer ML to be in contact with the channel layer 231. The channel contact structure 419 may include a conductive barrier layer 415 and a conductive pattern 417. The conductive barrier layer 415 of the channel contact structure 419 may be disposed between the channel layer 231 and the conductive pattern 417 of the channel contact structure 419, and extend along a sidewall of the conductive pattern 417. In an embodiment, the conductive barrier layer 415 may include titanium and titanium nitride, which may provide an ohmic contact.

A portion of the channel layer 231, which may be in contact with the doped semiconductor layer 241, and a portion of the channel layer 231, which may be adjacent to the channel contact structure 419, may be doped with an impurity. In an embodiment, a portion of the channel layer 231, which is in contact with the doped semiconductor layer 241, and a portion of the channel layer 231, which is adjacent to the channel contact structure 419, may be doped with an n-type impurity.

The doped semiconductor layer 241 may be used as the common source line CSL shown in FIG. 3, and the upper conductive layer 420 may be used as the bit line BL shown in FIG. 3. Although a structure corresponding to the embodiment shown in FIG. 2A is exemplified in FIG. 4C, the present disclosure is not limited thereto. In an embodiment, the doped semiconductor layer 241 may be replaced with a conductive pattern for the bit line BL shown in FIG. 2B, and the upper conductive layer 420 may be defined as a conductive pattern for the common source line CSL shown in FIG. 2B.

The gate conductive patterns GCP and interlayer insulating layers 209 of the cell stack structure ST[C] may surround the channel structure CH and extend toward the gate contact structures GCT. The gate conductive patterns GCP may be disposed between the interlayer insulating layers 209 adjacent to each other in the third direction Z, to be insulated from each other by the interlayer insulating layers 209. The gate conductive patterns GCP may be used as the source select line SSL, the drain select line DSL, and the word lines WL, which are described with reference to FIG. 3. Referring to FIG. 4C together with FIG. 4B, the insulating pattern 211A may be disposed between a region surrounding the channel structure CH of each of the gate conductive patterns GCP and a region connected to a corresponding gate contact structure GCT.

The gate conductive patterns GCP may include various conductive materials. In an embodiment, each of the gate conductive patterns GCP may include a conductive barrier layer 253 and a metal layer 255. The conductive barrier layer 253 may extend along a top surface, a bottom surface, and sidewalls of the metal layer 255.

The cell stack structure ST[C] may include a stepped structure, and a gap fill insulating layer 243 may be disposed between the stepped structure of the cell stack structure ST[C] and the bonding structure BS. An insulating layer 245 may be disposed between the gap fill insulating layer 243 and the bonding structure BS, and extend to overlap with the cell stack structure ST[C].

The gate conductive patterns GCP may be respectively connected to the gate contact structures GCT. Each of the gate contact do structures GCT may include a conductive barrier layer 405 and a conductive structure 407. The gate contact structures GCT may be respectively in contact with third horizontal parts HP3 of the gate conductive patterns GCP. The gate contact structures GCT may extend in the third direction Z to penetrate the bonding structure BS, the insulating layer 245, and the gap fill insulating layer 243. Portions of sidewalls of the gate contact structures GCT may be surrounded by the insulating pattern 211k For example, the gate contact structures GCT are physically and electrically isolated from each other by gate conductive patterns GCP disposed above a corresponding gate conductive pattern GCP and the insulating pattern 211A.

An oxide layer 401, a first upper insulating layer 411, and a second upper insulating layer 413 may be formed on an interlayer insulating layer 209 disposed at an uppermost portion. The channel contact structure 419 may be formed while penetrating the first upper insulating layer 411 and the oxide layer 401, and the upper conductive layer 420 may be formed while penetrating the second upper insulating layer 413.

The gate conductive patterns GCP may extend farther beyond the channel structure CH as the GCPs become more distant from the peripheral circuit layer 45, thereby forming a stepped structure. In other words, a length of the gate conductive patterns GCP extending from the channel structure CH may become shorter as the GCPs become closer to the peripheral circuit layer 45.

FIGS. 5 to 9, 10A, 10B, 11A, 11B, 12, 13A, 13B, 14A, and 14B are views illustrating a method of forming a cell stack structure in accordance with an embodiment of the present disclosure.

The method of forming the cell stack structure in accordance with the embodiment of the present disclosure will be described as follows.

Figure 5:
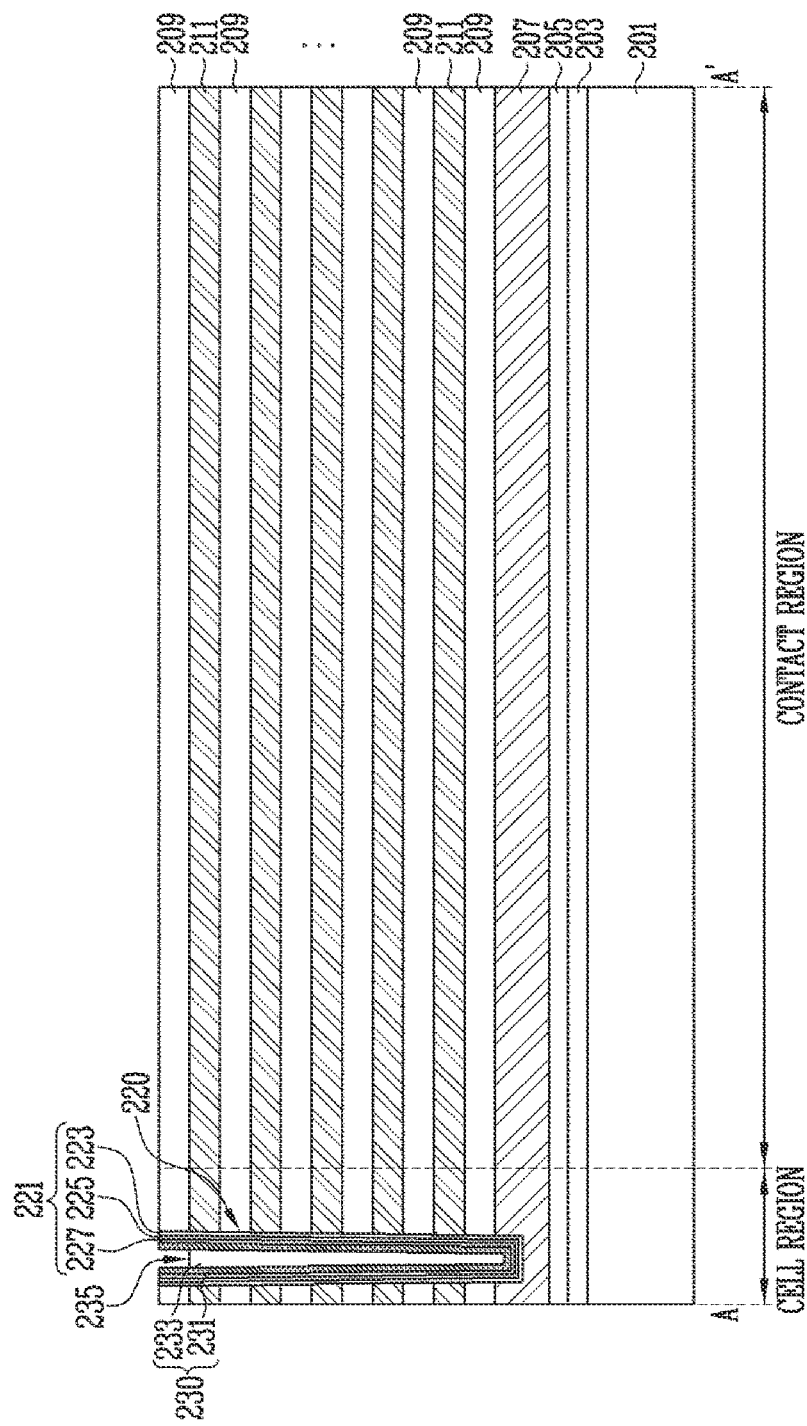

Referring to FIG. 5, a first protective layer 203, a second protective layer 205, and a third protectively layer 207 may be sequentially stacked on a sacrificial substrate 201 that includes a cell region and a contact region. The first protective layer 203 may be formed of a material which may serve as a barrier in a subsequent process of removing the sacrificial substrate 201, The second protective layer 205 may be formed of a material different from that of the first protective layer 203. The third protective layer 207 may be formed of a material different from that of the second protective layer 205. In an embodiment, the sacrificial substrate 201 may include silicon, the first protective layer 203 may include nitride, and the second protective layer 205 may include oxide.

Subsequently, interlayer insulating layers 209 and sacrificial layers 211 may be stacked alternately on the third protective layer 207.

The third protective layer 207 may be formed of a material which may serve as an etch stop layer in a subsequent process of etching the interlayer insulating layers 209 and the sacrificial layers 211.

The sacrificial layers 211 may include a material having an etch selectivity with respect to the interlayer insulating layers 209. The sacrificial layers 211 may be formed of an insulating material which may insulate gate conductive patterns and gate contact structures, which are formed in a subsequent process, from each other. The interlayer insulating layers 209 may be formed of an insulating material which may insulate between the gate conductive patterns. In an embodiment, the interlayer insulating layers 209 may include an oxide layer such as silicon oxide, and the sacrificial layers 211 may include a nitride layer such as silicon nitride.

Subsequently, the interlayer insulating layers 209 and the sacrificial layers 211 of the cell region may be etched, thereby forming a channel hole 220 penetrating the interlayer insulating layers 209 and the sacrificial layers 211. The third protective layer 207 may serve as an etch stop layer during an etching process of the interlayer insulating layers 209 and the sacrificial layers 211, which is performed to form the channel hole 220. After the interlayer insulating layers 209 and the sacrificial layers 211 are etched, the channel hole 220 may extend to the inside of the third protective layer 207 by etching a portion of the third protective layer 207.

Subsequently, the channel hole 220 may be filled with a memory layer 221 and a channel structure 230. The memory layer 221 may be formed by sequentially stacking a blocking insulating layer 223, a data storage layer 225, and a tunnel insulating layer 227 on a sidewall surface and a bottom surface of the channel hole 220. The channel structure 230 may be formed by forming a channel layer 231 on a surface of the memory layer 221 and filling a central region of the channel hole 220, which is opened by the channel layer 231, with a core insulating layer 233. Subsequently, a portion of the core insulating layer 233 may be removed such that a recess region 235 is defined on the top of the core insulating layer 233, The channel layer 231 may include a semiconductor layer which can be used as a channel region of a memory string.

The channel structure 230 may penetrate the interlayer insulating layers 209 and the sacrificial layers 211, and be spaced apart from the interlayer insulating layers 209 and the sacrificial layers 211 by the memory layer 221.

Figure 6:
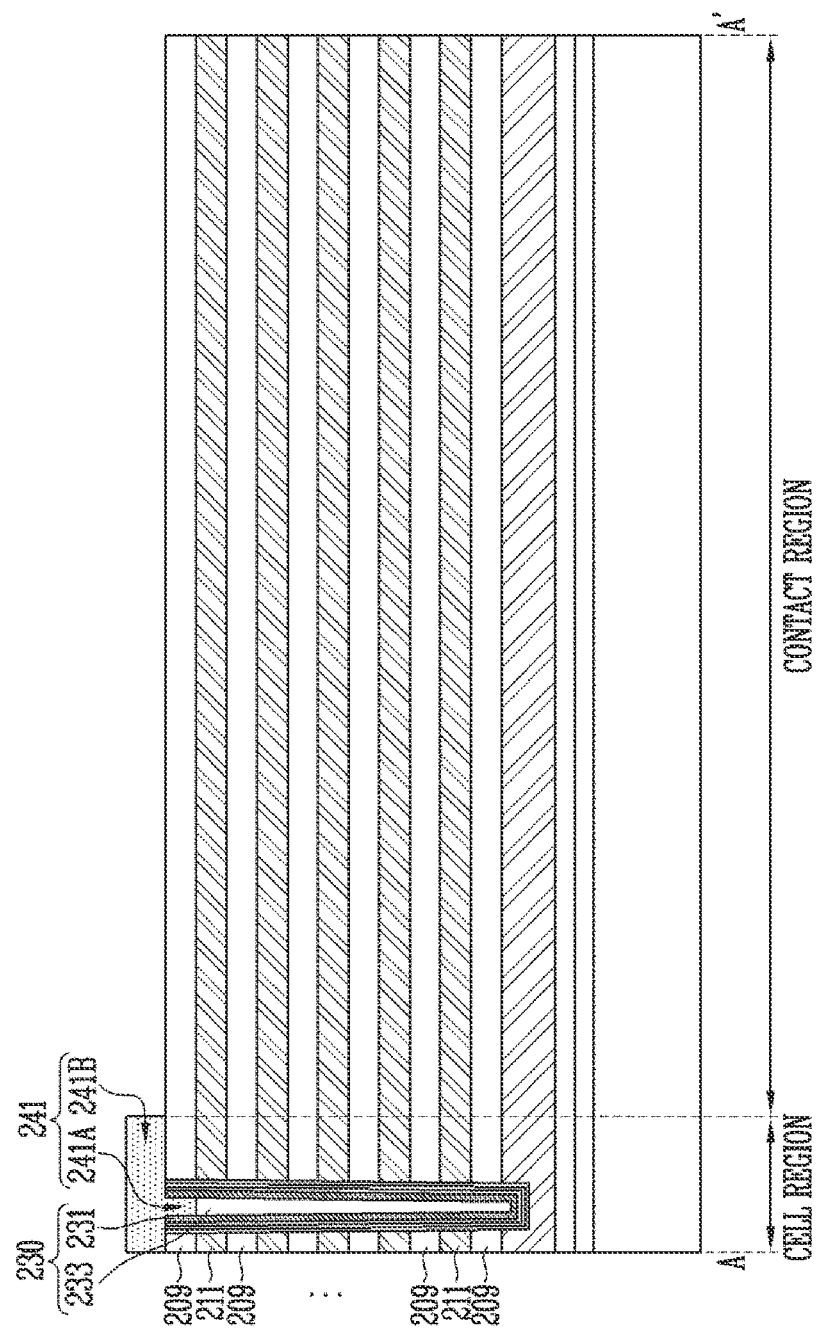

Referring to FIG. 6, a doped semiconductor layer 241 may be formed, which is connected to the channel structure 230, The doped semiconductor layer 241 may include a first pattern 241A filling the recess region 235 shown in FIG. 5 and a second pattern 241B extending from the first pattern 241A. The second pattern 241B may extend to cover a portion of a stacked structure of the interlayer insulating layers 209 and the sacrificial layers 211, In an embodiment, the doped semiconductor layer 241 may be etched as a pattern for the common source line CSL shown in FIG. 2A.

Figure 7:
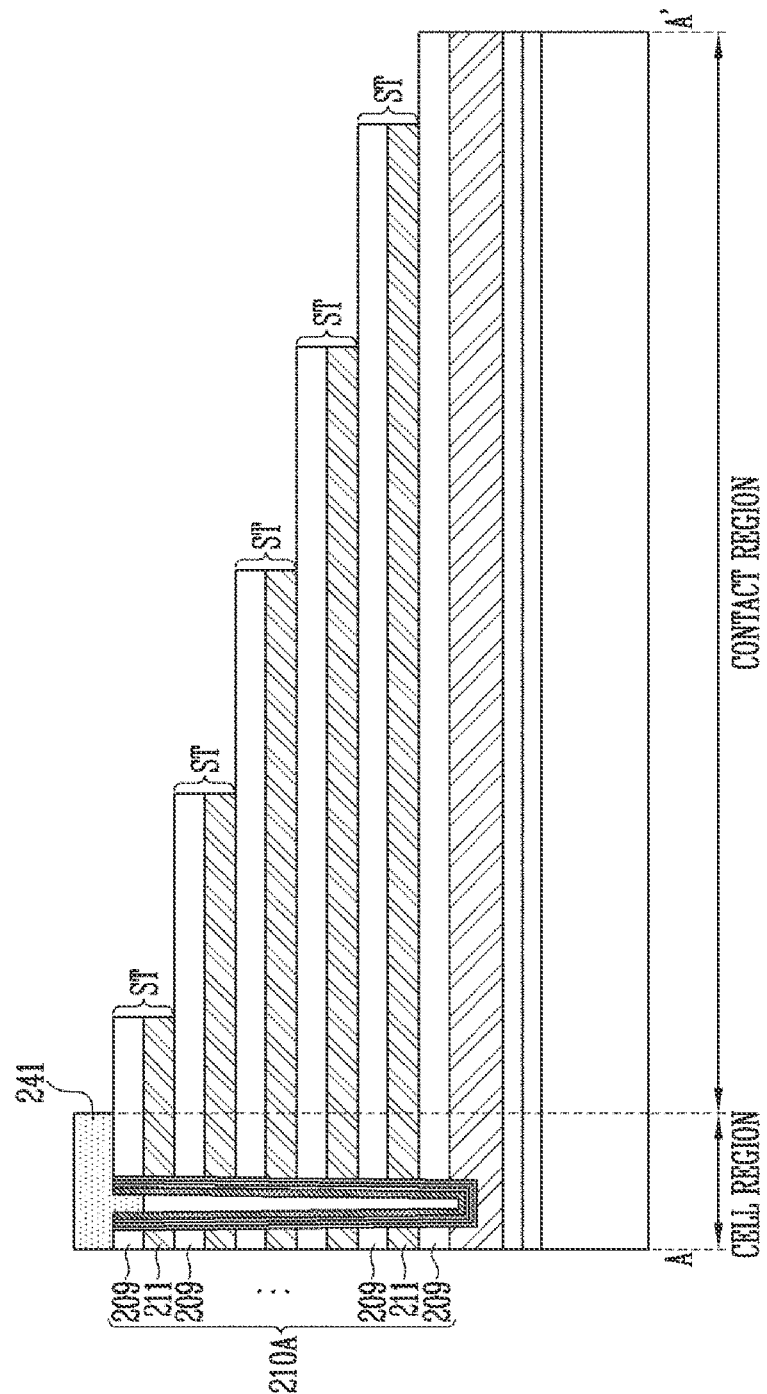

Referring to FIG. 7, the interlayer insulating layers 209 and the sacrificial layers 211, which are exposed by the doped semiconductor layer 241, may be etched, thereby forming a preliminary stepped structure 210A. The preliminary stepped structure 210A may include a plurality of steps ST. Each of the steps ST may include a sacrificial layer 211 and an interlayer insulating layer 209 on the sacrificial layer 211.

Figure 8:
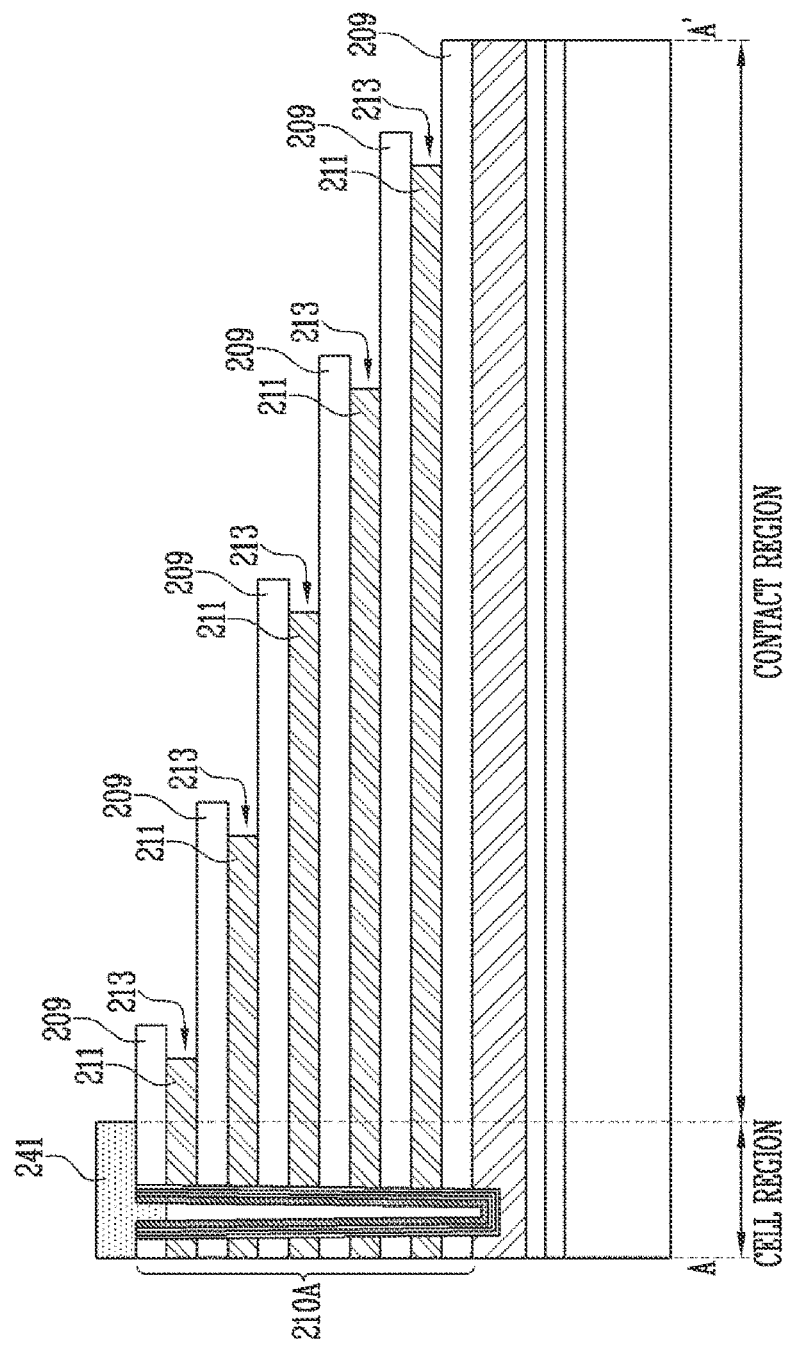

Referring to FIG. 8, a portion of each of the sacrificial layers 211 may be selectively etched from a sidewall of the preliminary stepped structure 210A. Accordingly, gaps 213 may be defined between the interlayer insulating layers 209.

Figure 9:
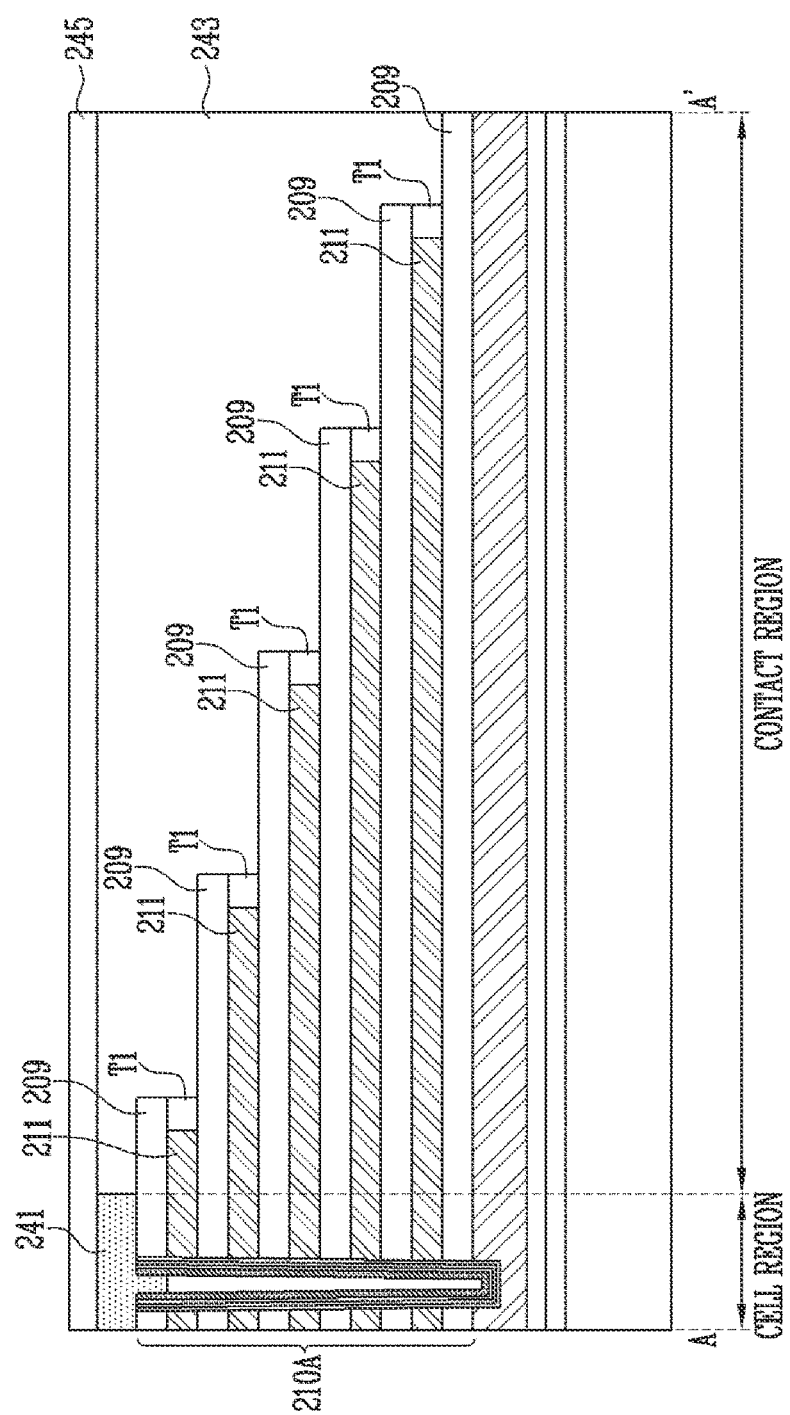

Referring to FIG. 9, a gap fill insulating layer 243 may be formed on the entire structure including the preliminary stepped structure 210A and the doped semiconductor layer 241. The gap fill insulating layer 243 may be formed of a material having a low step coverage such that the gaps shown in FIG. 8 are not buried. Therefore, a first tunnel T1 as an empty space is formed as an empty space at an end portion of each of the sacrificial layers 211.

Subsequently, a mask process and an etching process may be performed to partially remove the gap fill insulating layer 243 formed on the cell region, and a planarization process may be performed to expose a surface of the doped semiconductor layer 241. Therefore, the gap fill layer 243 formed on the cell region may be removed.

Subsequently, an insulating layer 245 may be formed on the entire structure including the doped semiconductor layer 241 and the gap fill insulating layer 243. The insulating layer 245 may include an oxide layer.

Figure 10A:
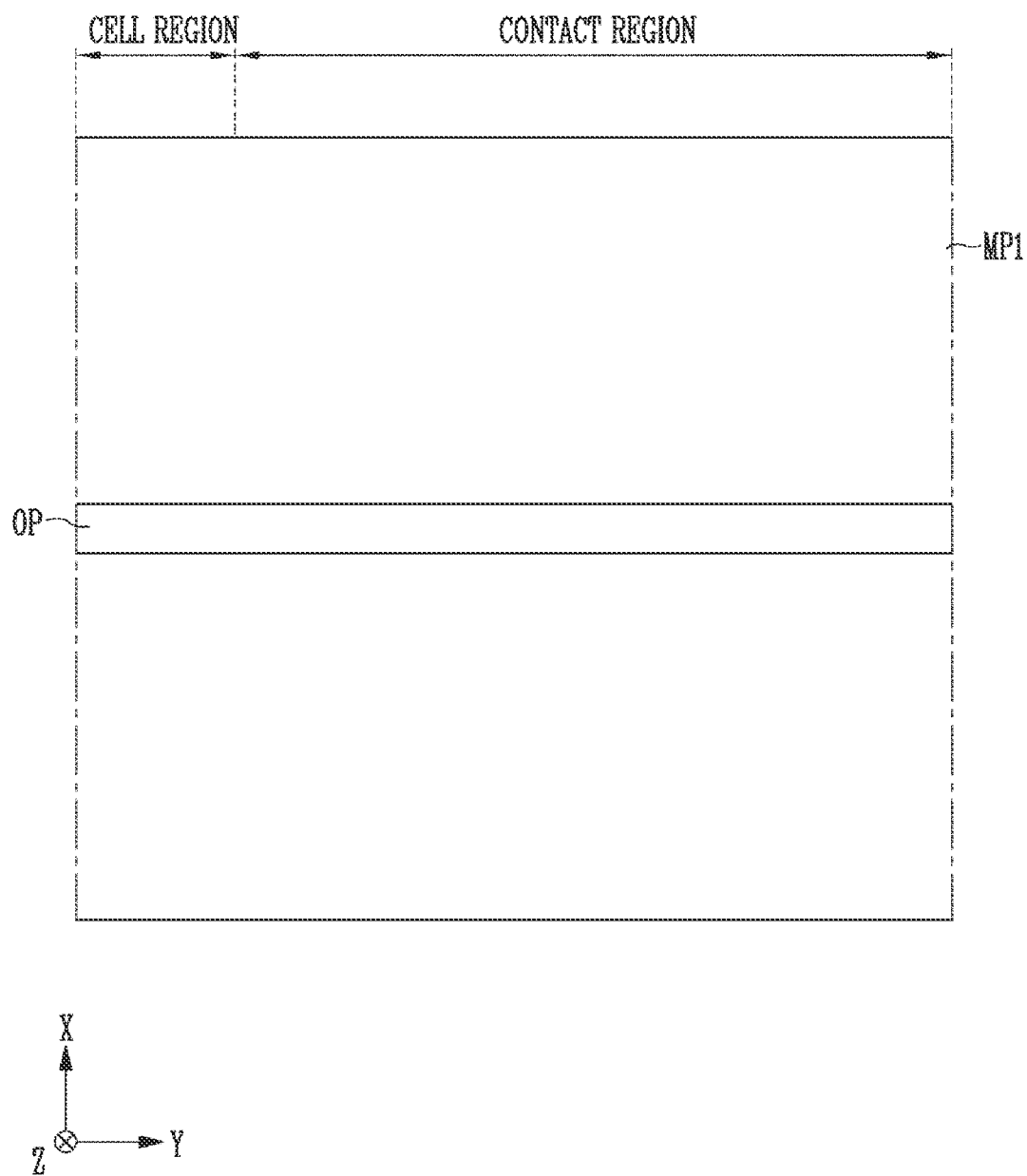
Figure 10B:
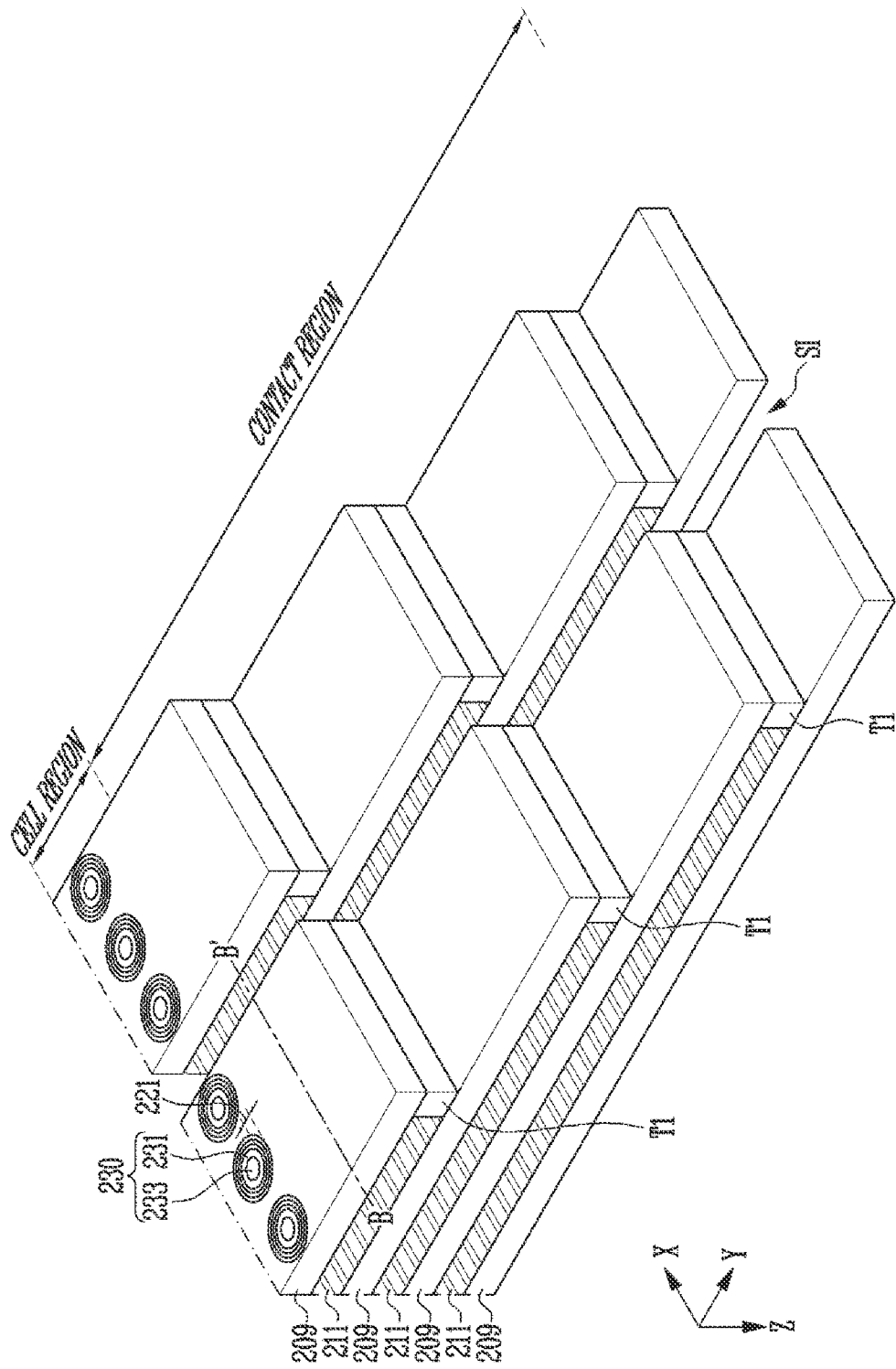

FIG. 10A is a plan view illustrating a first mask pattern MP1 formed on the entire structure formed through the process shown in FIG. 9, FIG. 10B is a perspective view illustrating a stack structure formed through an etching process using the first mask pattern MP1 shown in FIG. 10A.

Referring to FIGS. 10A and 10B, the first mask pattern MP1 in which a slit formation space OP is opened may be formed on the entire structure formed through the process shown in FIG. 9. Subsequently, a slit SI may be formed by etching the gap fill insulating layer 243, the doped semiconductor layer 241, and the plurality of steps ST, which are shown in FIG. 9, through an etching process using the first mask pattern MP1. Therefore, a plurality of stepped structures may be spaced apart from each other by the slit SI. The first tunnel T1 may be disposed at an end portion of each of the sacrificial layers 211 to extend in a first direction X.

The doped semiconductor layer 241 shown in FIG. 9 may be disposed on the top of the channel structure 230, and the gap fill insulating layer 243 shown in FIG. 9 may be disposed on the top of the stepped structure. However, illustration of the doped semiconductor layer 241 and the gap fill insulating layer 243 is omitted for convenience of description.

Figure 11A:
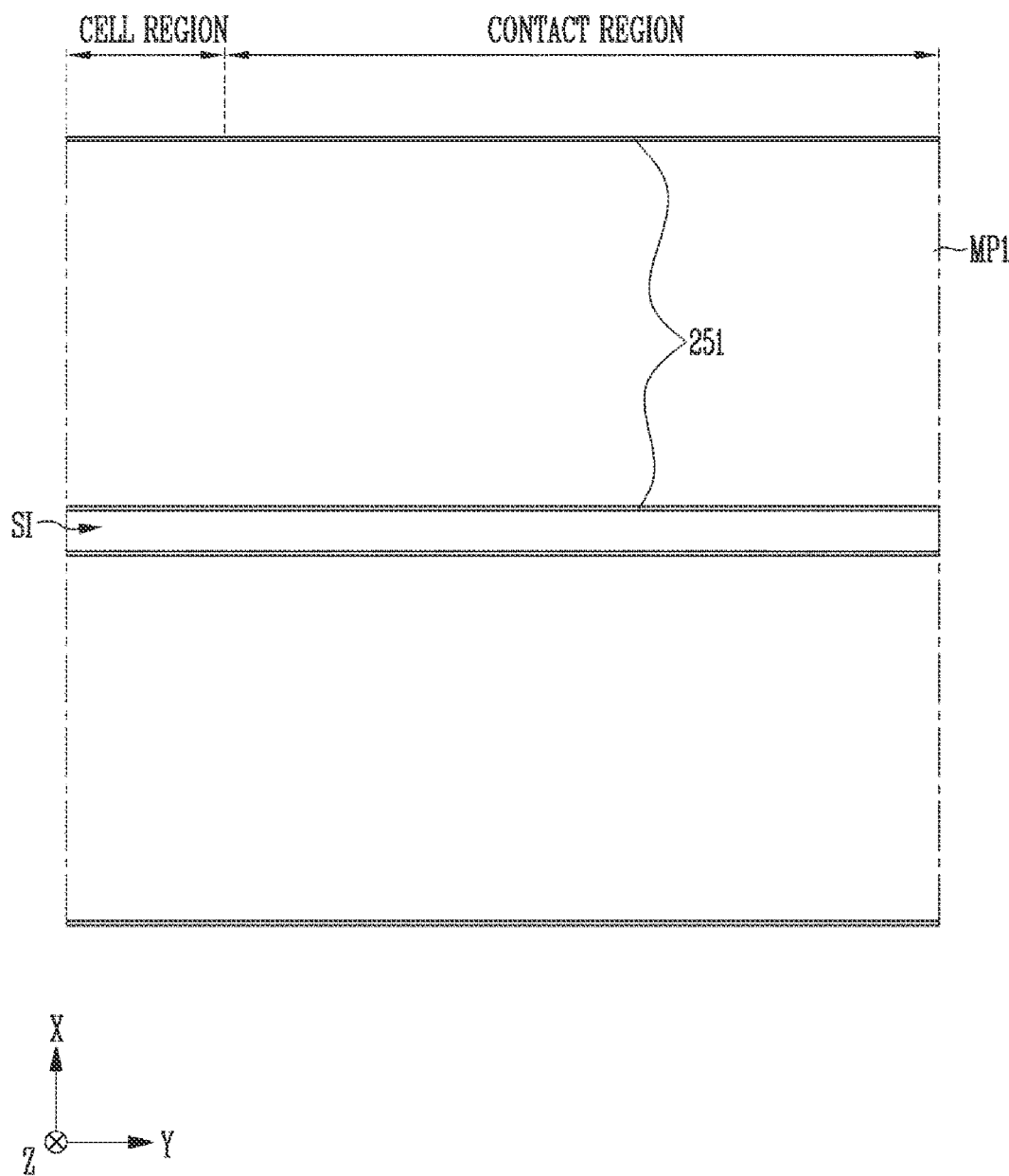
Figure 11B:
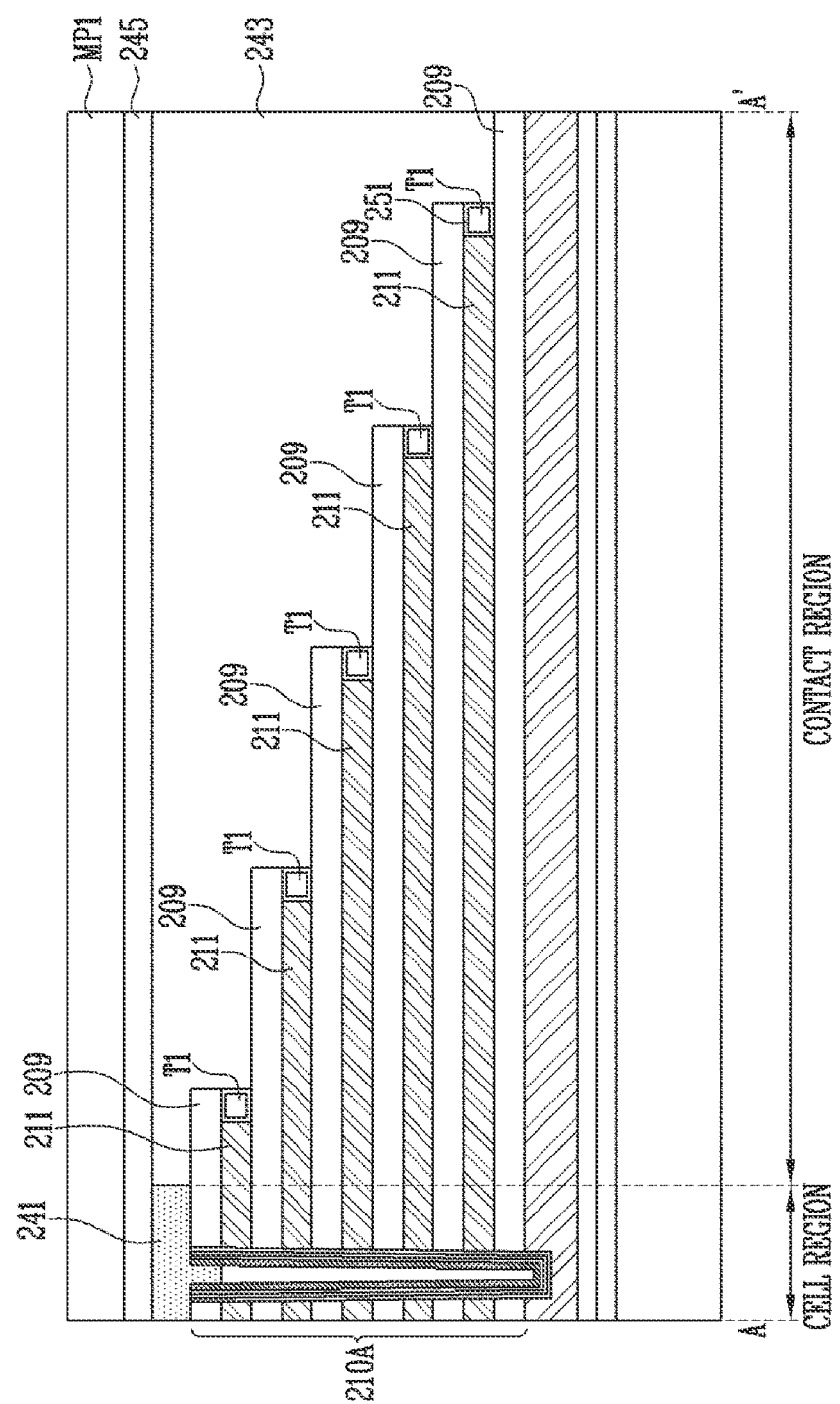

Referring to FIGS. 11A and 11B, after the process of forming the slit SI, a protective layer 251 may be formed, which extends along an exposed sidewall of the slit SI and exposed internal surface of the first tunnel T1, The protective layer 251 may include a material having an etch selectivity with respect to the sacrificial layer 211. In an embodiment, the protective layer 251 may include at least one of polysilicon, silicon germanium, and silicon carbon oxide. The protective layer 251 may prevent the sacrificial layer 211 on the contact region from being removed in a subsequent process of removing the sacrificial layer 211 on the cell region.

Referring to FIG. 12, the first mask pattern may be removed, and a second mask pattern MP2 covering the top of the contact region may be formed on the top of the insulating layer 245, The second mask pattern MP2 may be formed such that the cell region is opened. Subsequently, the protective layer 251 formed on the cell region in the protective layer 251 formed on the cell region and the contact region may be removed by performing an etching process. Therefore, the protective layer 251 may remain in only the contact region.

Subsequently, a space in which gate conductive patterns are to be formed may be formed by removing the sacrificial layer on the cell region exposed through the slit through the etching process. The sacrificial layer 211 formed on the contact region may be in a state in which the sacrificial layer 211 is not exposed through the slit since a sidewall of the sacrificial layer 211 is surrounded by the protective layer 251. Accordingly, etching is prevented by the protective layer 251 formed on the sidewall of the sacrificial layer 211 formed on the contact region in the process of removing the sacrificial layer formed on the cell region.

Figure 13A:
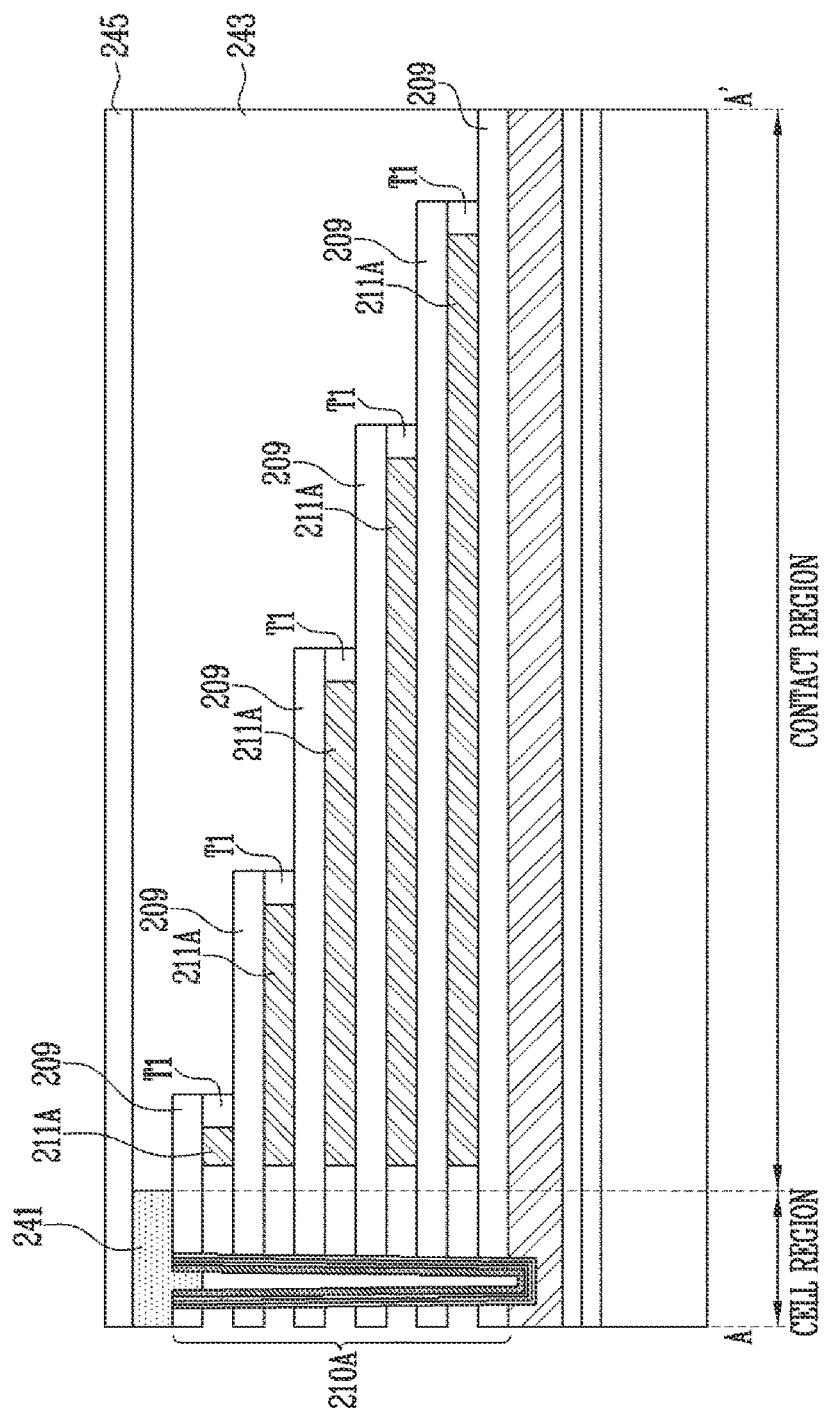

Referring to FIG. 13A, the second mask pattern may be removed, and the protective layer formed on the contact region may be removed. Therefore, a side surface of the sacrificial layer formed on the contact region may be exposed through the slit SI.

Subsequently, an insulating pattern 211A may be formed by etching, to a predetermined thickness, the sidewall of the sacrificial layer formed on the contact region through an etching process. For example, the sidewall of the sacrificial layer formed on the contact region may be etched to a thickness of 50 nm to 100 nm.

Figure 13B:
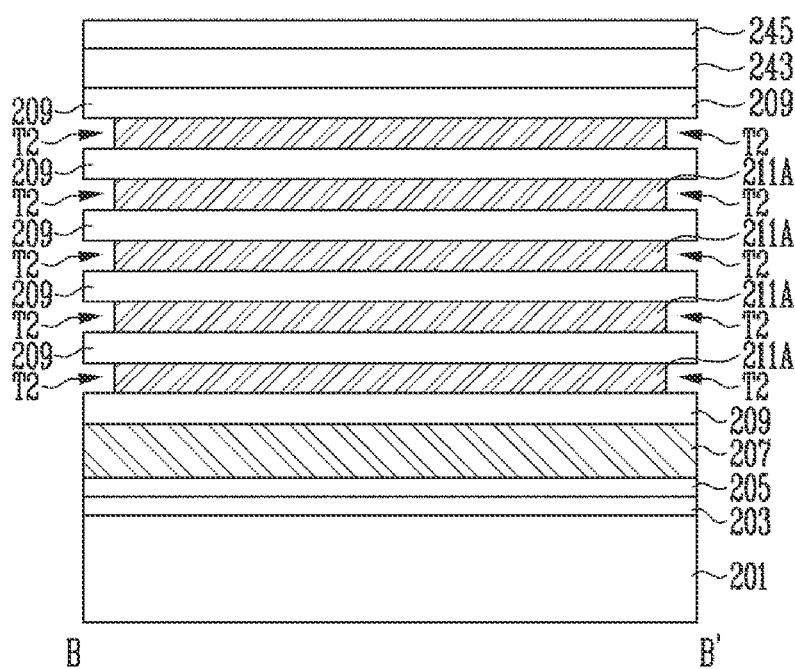

FIG. 13B is a sectional view taken along line B-B', illustrating a process of etching the sidewall of the sacrificial layer formed on the contact region, and the line B-B' illustrates a section taken along the first direction X, which is shown in FIG. 10B.

Referring to FIG. 13B, the insulating pattern 211A may be formed by etching, to a predetermined thickness, the sacrificial layer through which the sidewall is exposed through the slit, and second tunnels T2 as empty spaces may be formed at both end portions of the insulating patterns 211A. Second tunnels T2 disposed in the same layer may be connected to each other by the first tunnel T1 shown in FIG. 13A.

Referring to FIG. 14A, gate conductive patterns GCP are formed by sequentially forming a conductive barrier layer 253 and a metal layer 255 on an internal surface of a space in which the gate conductive patterns on the cell region may be formed. Simultaneously, the conductive barrier layer 253 and the metal layer 255 are sequentially formed on internal surfaces of the first and second tunnels on the contact region. For example, after the conductive barrier layer 253 is deposited along the internal surfaces of the first and second tunnels, internal spaces of the first and second tunnels may be filled with the metal layer 255. Subsequently, the gate conductive patterns GCP may be isolated from each other by etching a slit region. The slit region may be filled with an insulating material.

Figure 14B:
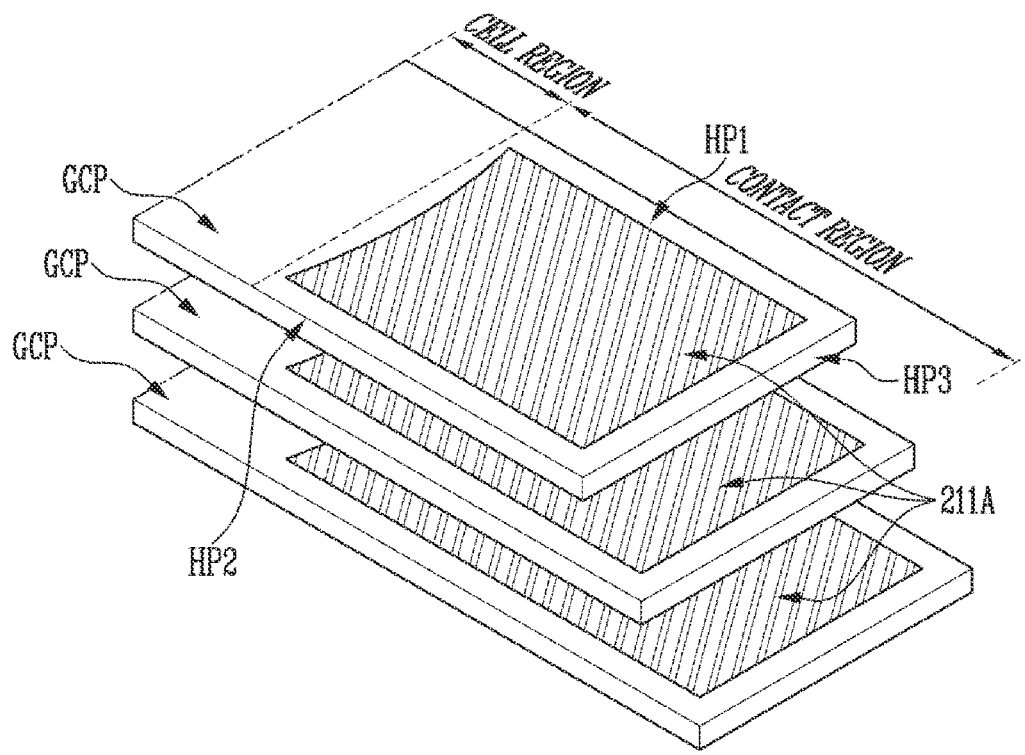

Referring to FIG. 14B, each of the gate conductive patterns GCP may include a first horizontal part HP1 and a second horizontal part HP2, which extend in parallel to each other from the cell region to the contact region, and one end portion of the first horizontal part HP1 and one end portion of the second horizontal part HP2 are connected to each other by a third horizontal part HP3. Also, the insulating pattern 211A is disposed in a space between the first horizontal part HP1 and the second horizontal part HP2 of each of the gate conductive patterns GCP.

Figure 15:
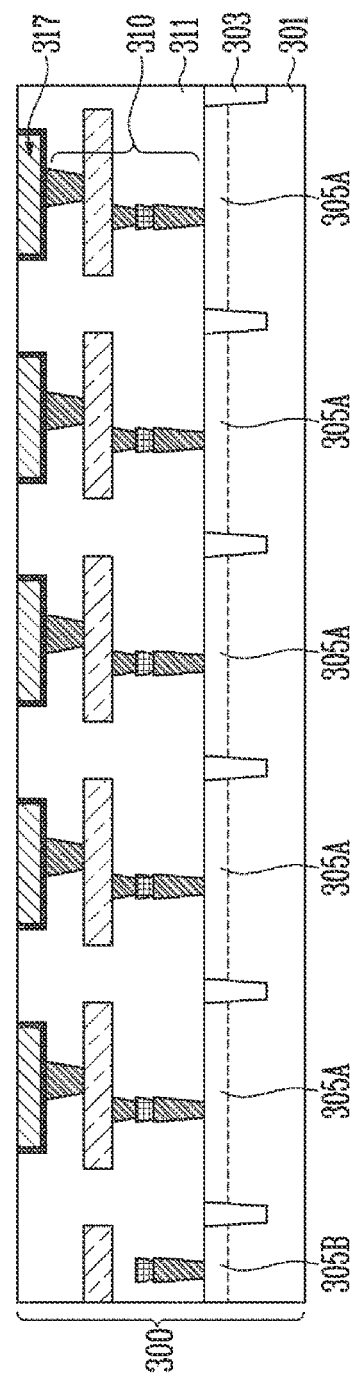
FIG. 15 is a sectional view illustrating a peripheral circuit layer in accordance with an embodiment of the present disclosure.

FIG. 15 is a sectional view illustrating a peripheral circuit layer in accordance with an embodiment of the present disclosure.

Referring to FIG. 15, the peripheral circuit layer 300 may include a substrate 301 including isolation layers 303 and impurity regions 305A and 3053, interconnection structures 310 connected to the impurity region 305A and 3053, and conductive pads 317. Although not shown in the drawing, a plurality of transistors may be formed on the impurity regions 305A and 305B. The interconnection structures 310 and the conductive pads 317 may be buried in an insulating structure 311 formed on the substrate 301.

FIGS. 16A to 16E are sectional views illustrating a method of bonding a cell stack structure and a peripheral circuit layer and a method of forming a gate contact structure in accordance with an embodiment of the present disclosure.

The method of bonding the peripheral circuit layer 300 shown in FIG. 15 and the cell stack structure shown in FIG. 14A and the method of forming the gate contact structure will be described as follows.

Figure 16A:
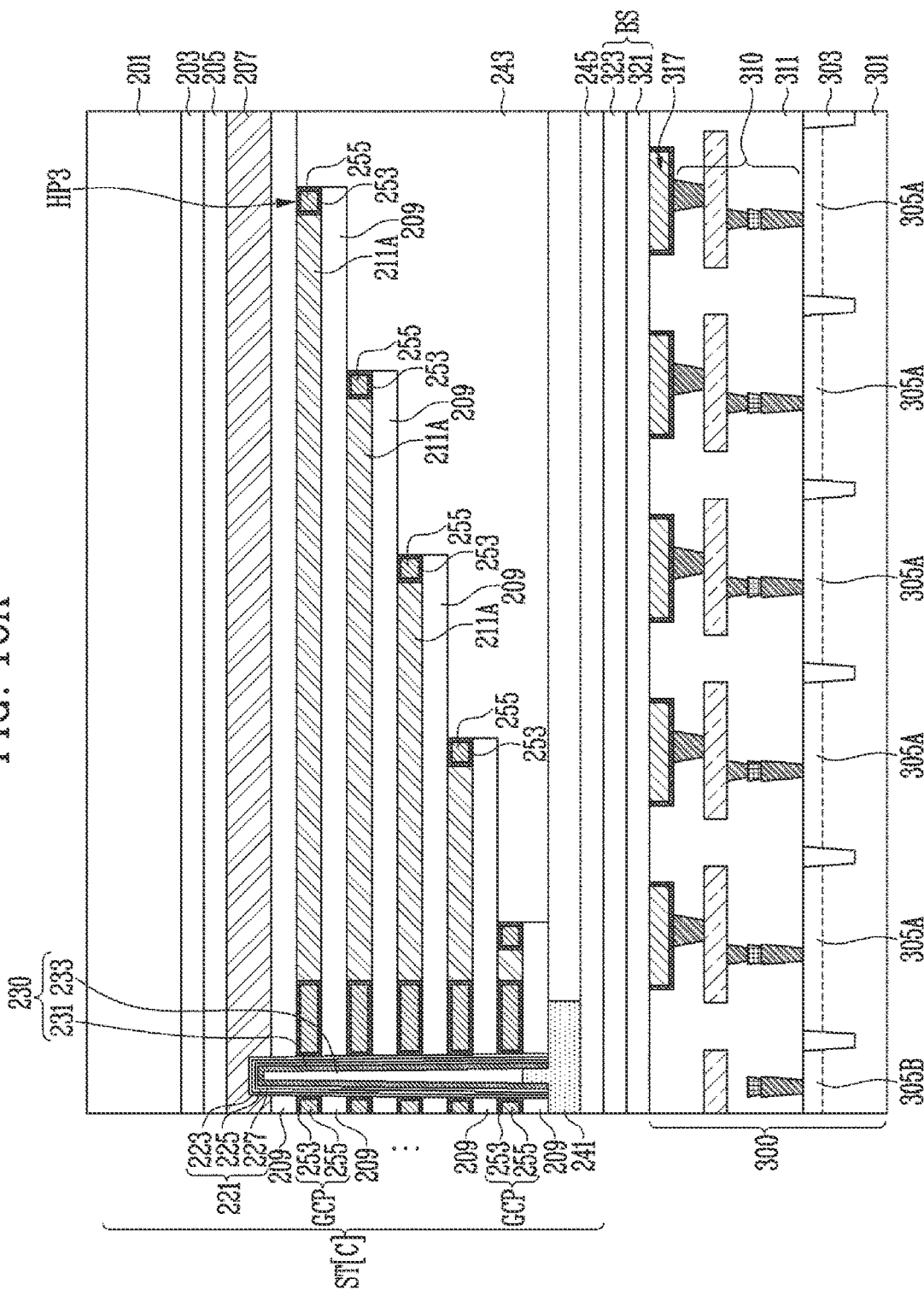
FIGS. 16A to 16E are sectional views illustrating a method of bonding a cell stack structure and a peripheral circuit layer and a method of forming a gate contact structure in accordance with an embodiment of the present disclosure.

Referring to FIG. 16A, a first insulating layer 321 may be formed on the entire structure of the peripheral circuit layer 300, and a second insulating layer 323 is formed on the insulating layer 245 of the cell stack structure ST[C]. The first insulating layer 321 and the second insulating layer 323 may be formed of various dielectrics which enable dielectric-to-dielectric bonding. In an embodiment, each of the first insulating layer 321 and the second insulating layer 323 may include an oxide layer.

Subsequently, the second insulating layer 323 may be bonded to the first insulating layer 321 covering the peripheral circuit layer 300 through a bonding process. In the bonding process, the gate conductive patterns may be arranged such that the third horizontal part HP3 of each of the gate conductive patterns overlaps with each of the conductive pads 317 of the peripheral circuit layer 300.

Figure 16B:
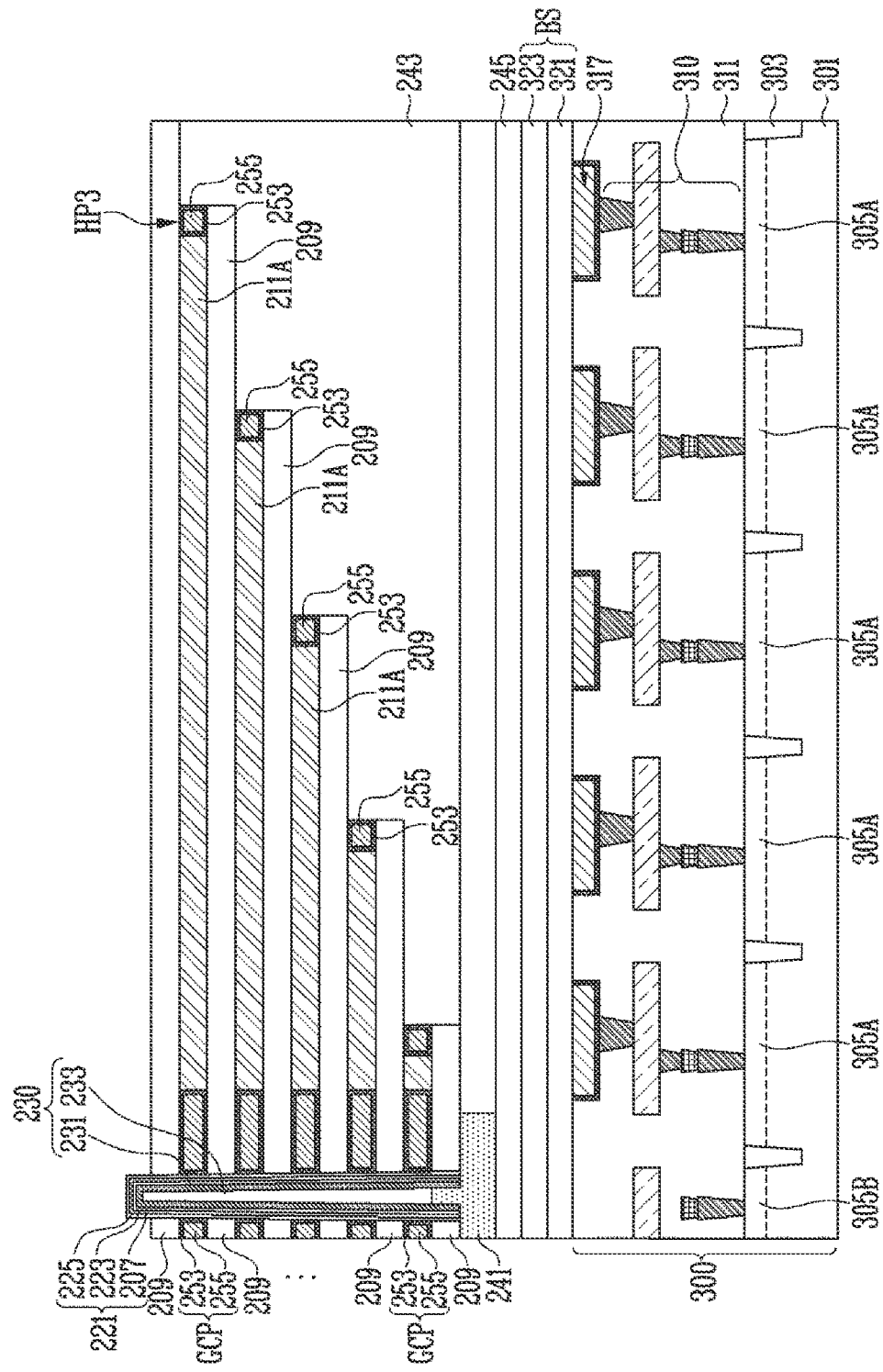

Referring to FIG. 16B, after the bonding process, the sacrificial substrate 201, the first protective layer 203, the second protective layer 205, and the third protective layer 207, which are shown in FIG. 16A, may be sequentially removed.

Figure 16C:
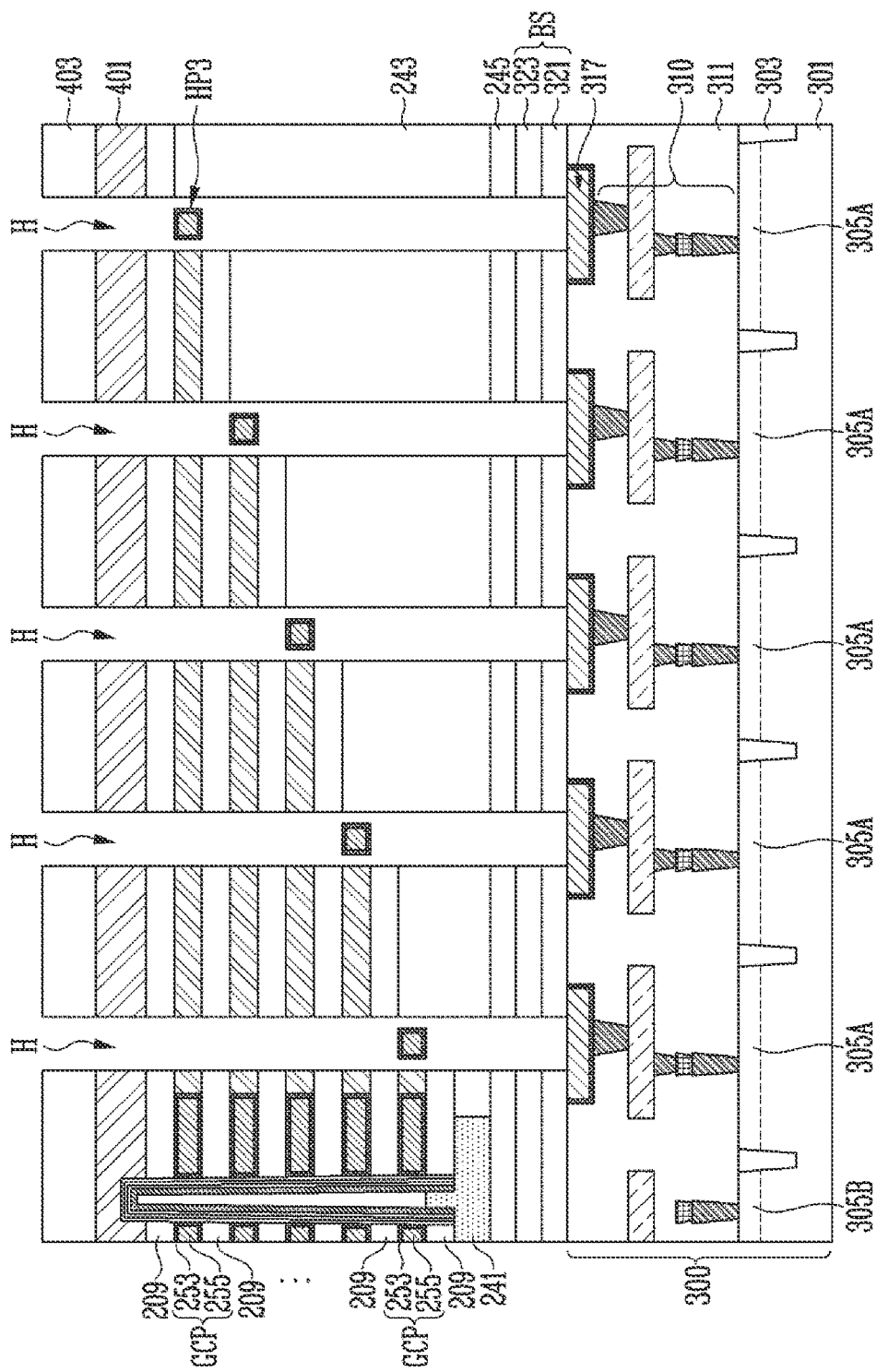

Referring to FIG. 16C, an oxide layer 401 and a hard mask pattern 403 may be sequentially formed on an interlayer insulating layer 209 disposed at an uppermost portion, and contact holes H exposing the conductive pads 317 may be formed by performing a contact hole etching process using the hard mask layer 403 and the oxide layer 401. The contact holes H may be formed while penetrating the third horizontal parts HP3.

Figure 16D:
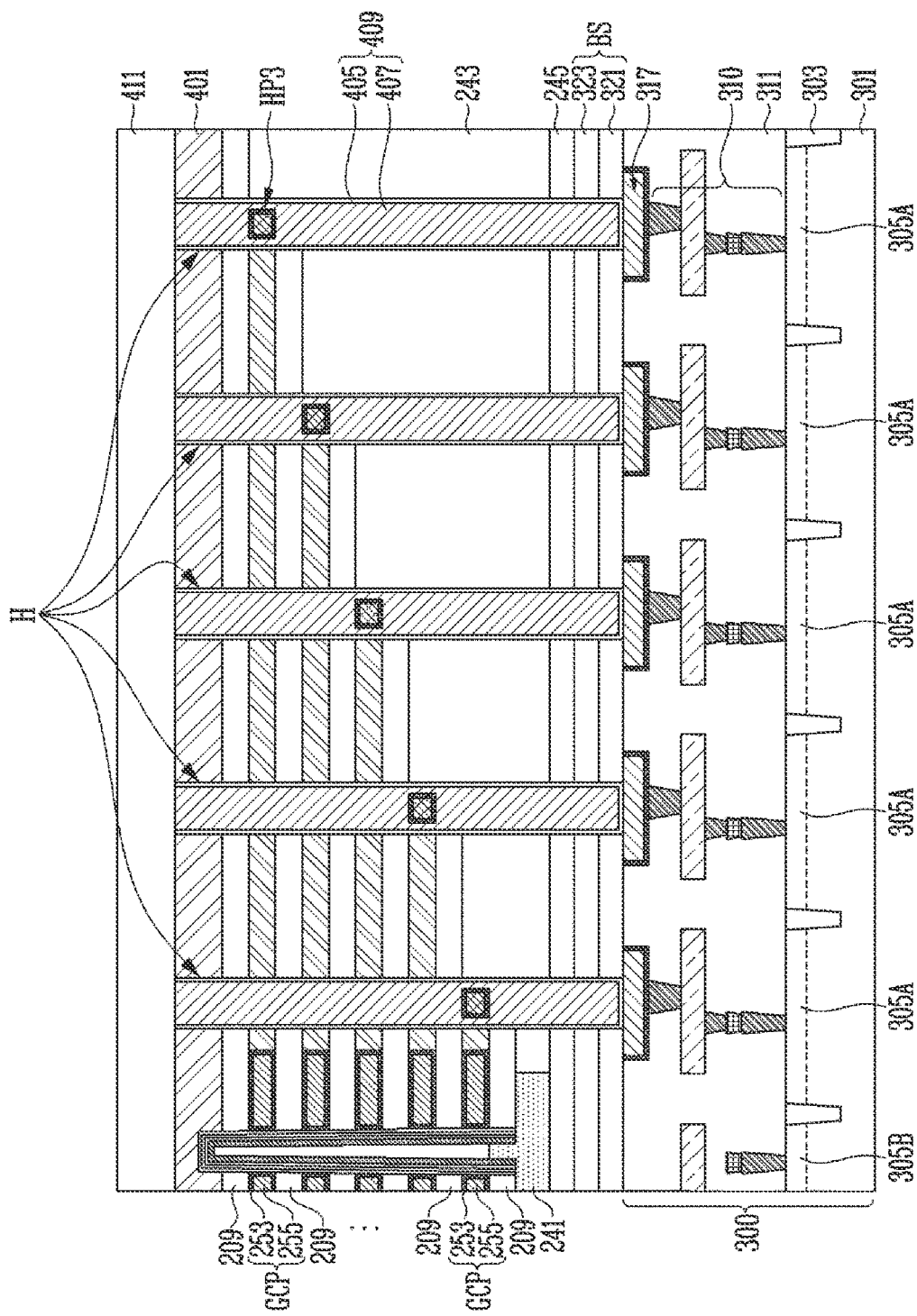

Referring to FIG. 16D, a conductive barrier layer 405 may be formed along sidewalls and bottom surfaces of the contact holes H, and a conductive structure 407 may be formed such that contact holes H are buried. Subsequently, the mask pattern may be removed by performing a planarization process such that the oxide layer 401 is exposed, and gate contact structures 409 may be formed in the contact holes H. The conductive barrier layer 405 may be formed to surround a sidewall and a bottom surface of the conductive structure 407.

Each of the gate contact structures 409 may penetrate the third horizontal part HP3 of a corresponding gate conductive pattern. Therefore, each of the gate contact structures 409 may be electrically and physically connected to a sidewall of the third horizontal part HP3 of a corresponding conductive pattern.

Subsequently, a first upper insulating layer 411 may be formed on the entire structure including the oxide layer 401 and the gate contact structures 409.

Figure 16E:
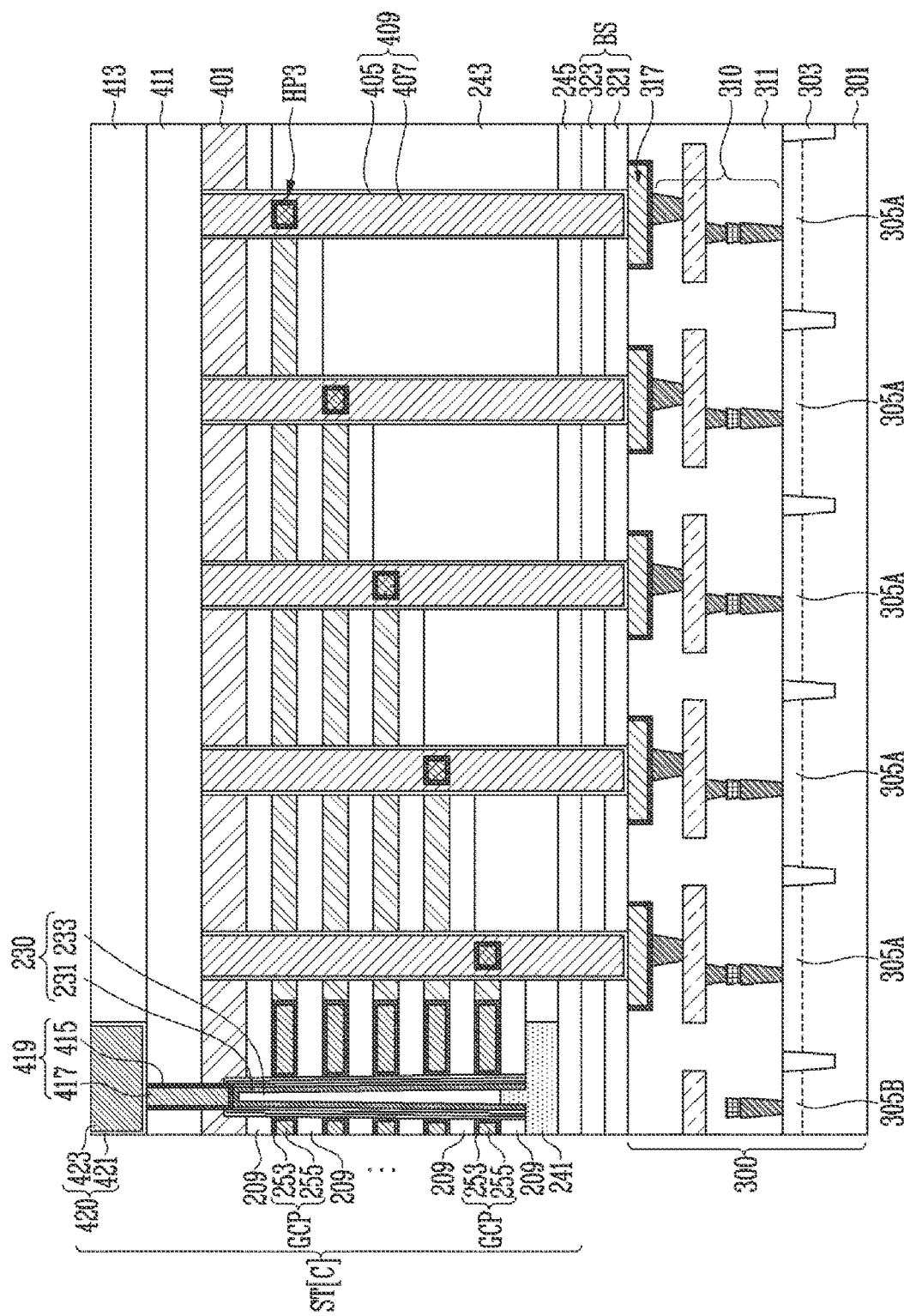

Referring to FIG. 16E, a hole may be formed by etching the first upper insulating layer 411 and the oxide layer 401 to expose an upper surface of the channel structure 230, and a channel contact structure 419 may be formed in the hole. The channel contact structure 419 may be formed by forming a conductive barrier layer 415 on a sidewall and a bottom surface of the hole and filling the hole with a conductive pattern 417.

Subsequently, a second upper insulating layer 413 may be formed on the entire structure including the channel contact structure 419 and the first upper insulating layer 411. The second insulating layer 413 may be etched to form a trench exposing an upper portion of the channel contact structure 419. Subsequently, an upper conductive layer 420 may be formed by sequentially forming a conductive barrier layer 421 and a conductive pattern 423 in the trench of the second upper insulating layer 413. The conductive barrier layer 421 may extend along a sidewall and a bottom surface of the conductive pattern 423.

Figure 17:
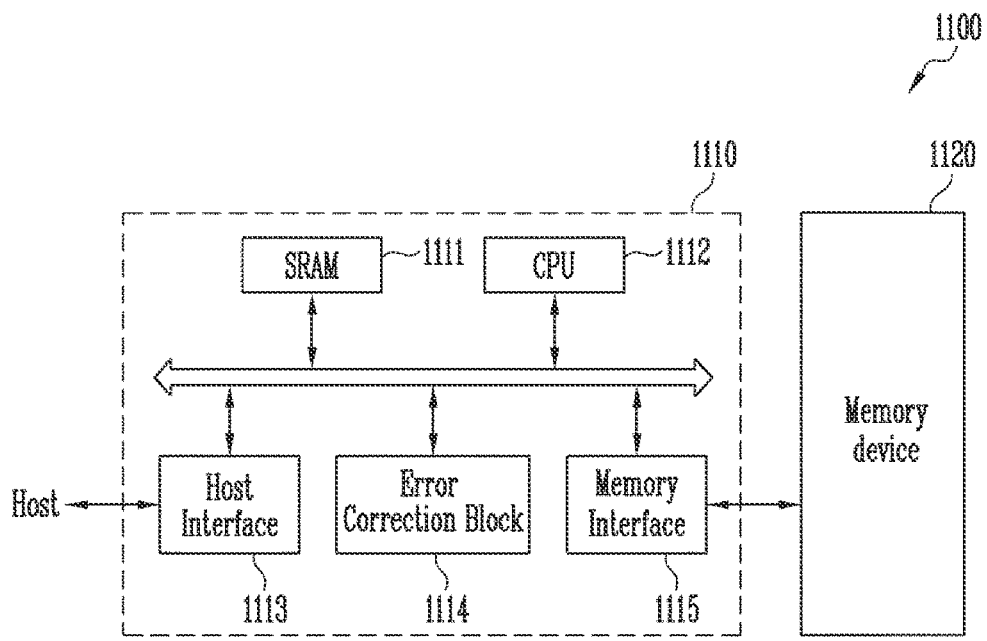
FIG. 17 is a block diagram illustrating a configuration of a memory system in accordance with an embodiment of the present disclosure.

FIG. 17 is a block diagram illustrating a configuration of a memory system 1100 in accordance with an embodiment of the present disclosure.

Referring to FIG. 17, the memory system 1100 may include a memory device 1120 and a memory controller 1110.

The memory device 1120 may be a multi-chip package configured with a plurality of flash memory chips. The memory device 1120 may include a peripheral circuit layer and a stack structure, which are bonded to each other through a bonding structure. The stack structure may include a cell stack structure. A gate contact structure connected to a gate conductive pattern of the cell stack structure may be connected to the peripheral circuit layer while penetrating the cell stack structure and the bonding structure.

The memory controller 1110 may control the memory device 1120, and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect and correct an error included in a data read from the memory device 1120. The memory interface 1115 may interface with the memory device 1120. The memory controller 1110 may further include a Read Only Memory (ROM) (not shown) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer System Interface (SCSI) protocol, an Enhanced Small Disk Interface (ESDI) protocol, and an Integrated Drive Electronics (IDE) protocol.

Figure 18:
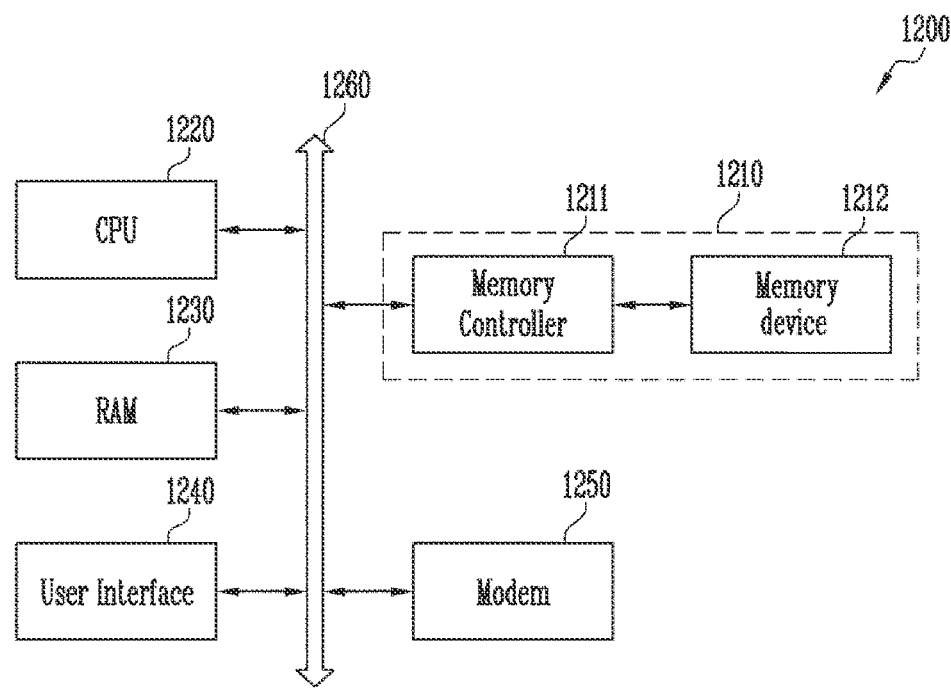
FIG. 18 is a block diagram illustrating a configuration of a computing system in accordance with an embodiment of the present disclosure.

FIG. 18 is a block diagram illustrating a configuration of a computing system 1200 in accordance with an embodiment of the present disclosure.

Referring to FIG. 18, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211. The memory device 1212 may be configured identically to the memory device 1120 described with reference to FIG. 17. The memory controller 1211 may be configured identically to the memory controller 1100 described with reference to FIG. 17.

In accordance with the present disclosure, a gate contact structure may be connected to a peripheral circuit layer while penetrating a bonding structure, so that the bonding structure may be simplified through dielectric-to-dielectric bonding. Accordingly, a bonding structure failure may be minimized, and thus the operational reliability of the memory device may be improved.

In accordance with the present disclosure, a bridge phenomenon between conductive layers for word lines may be prevented, and an additional metal line for connecting the peripheral circuit layer and the gate contact structure may be unnecessary, so that a wiring process may be simplified.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications may be made on the basis of the technological scope of the present disclosure in addition to the embodiments disclosed herein. So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A memory device comprising:
a first gate conductive pattern disposed to extend horizontally on a cell region and a contact region, the first gate conductive pattern including a first horizontal part and a second horizontal part, which extend in parallel to each other to the contact region, and a third horizontal part connected to one end portion of the first horizontal part and one end portion of the second horizontal part;
a first insulating pattern disposed between the first horizontal part and the second horizontal part of the first gate conductive pattern;
a second gate conductive pattern disposed in parallel to the first gate conductive pattern under the first gate conductive pattern, the second gate conductive pattern including a fourth horizontal part and a fifth horizontal part, which extend in parallel to each other to the contact region, and a sixth horizontal part connected to one end portion of the fourth horizontal part and one end portion of the fifth horizontal part;
a first gate contact structure extending vertically on the contact region, the first gate contact structure being in contact with the first gate conductive pattern while penetrating the third horizontal part of the first gate conductive pattern; and
a second gate contact structure extending vertically on the contact region, the second gate contact structure being in contact with the second gate conductive pattern while penetrating the first insulating pattern and penetrating the sixth horizontal part of the second gate conductive pattern.

2. The memory device of claim 1, further comprising a second insulating pattern disposed between the fourth horizontal part and the fifth horizontal part of the second gate conductive pattern.

3. The memory device of claim 1,
wherein a length of the second gate conductive pattern extending to the contact region is shorter than that of the first gate conductive pattern extending to the contact region.

4. The memory device of claim 1,
wherein the first gate contact structure is disposed to extend vertically in an external region of the second gate conductive pattern.

5. The memory device of claim 1,
wherein the first gate contact structure is electrically in contact with the third horizontal part.

6. The memory device of claim 1,
wherein the second gate contact structure is electrically and physically in contact with the sixth horizontal part, and is electrically and physically spaced apart from the first gate conductive pattern by the first insulating pattern.

7. The memory device of claim 1, further comprising an interlayer insulating layer formed between the first gate conductive pattern and the second gate conductive pattern.

8. A memory device comprising:
a peripheral circuit layer including a plurality of conductive pads;
a bonding structure disposed on the peripheral circuit layer;
a cell stack structure disposed on the bonding structure, the cell stack structure comprising a plurality of gate conductive patterns and a plurality of insulating patterns; and
a plurality of gate contact structures respectively connecting the plurality of conductive pads and the plurality of gate conductive patterns while penetrating the bonding structure,
wherein each of the plurality of gate conductive patterns includes a first horizontal part and a second horizontal part, which extend horizontally from a cell region to a contact region, a third horizontal part connected to one end of the first horizontal part and one end of the second horizontal part, the third horizontal part being connected to a corresponding gate contact structure among the plurality of gate contact structures, and at least one insulating pattern disposed between the first horizontal part and the second horizontal part.

9. The memory device of claim 8,
wherein the plurality of gate conductive patterns are arranged to be sequentially stacked, and a length of the first horizontal part and the second horizontal part becomes longer as the sequential stacking of the gate conductive patterns increases in a vertical direction.

10. The memory device of claim 9, further comprising an interlayer insulating layer formed between the plurality of gate conductive patterns.

11. The memory device of claim 8,
wherein each of the plurality of gate contact structures penetrates the insulating patterns disposed between the first horizontal part and the second horizontal part of at least one gate conductive pattern disposed above a corresponding gate conductive pattern among the plurality of gate conductive patterns.

12. The memory device of claim 8,
wherein each of the plurality of gate contact structures penetrates a region between the first horizontal part and the second horizontal part of at least one gate conductive pattern disposed above a corresponding gate conductive pattern among the plurality of gate conductive patterns.

13. The memory device of claim 9,
wherein each of the plurality of gate contact structures extends vertically in an external region of at least one gate conductive pattern disposed under a corresponding gate conductive pattern among the plurality of gate conductive patterns.

14. A method of manufacturing a memory device, the method comprising:
forming a cell stack structure by forming a stepped structure including interlayer insulating layers stacked to be spaced apart from each other while surrounding a channel structure and sacrificial layers surrounding the channel structure between the interlayer insulating layers on a sacrificial substrate including a cell region and a contact region;

forming gaps in sidewalls of the interlayer insulating layers by etching sidewalls of the sacrificial layers such that the interlayer insulating layers protrude farther than the sacrificial layers;

forming a first tunnel extending in a first direction in the sidewall of each of the sacrificial layers by forming a gap fill insulating layer on the entire structure including the stepped structure;

exposing the sidewalls of the sacrificial layers and the first tunnel by performing a slit process of etching the gap fill insulating layer and the stepped structure in a second direction perpendicular to the first direction;

forming second tunnels by selectively removing the sacrificial layers of the cell region and etching sidewalls of the sacrificial layers of the contact region to a predetermined thickness, wherein the second tunnels are respectively connected to both end portions of the first tunnel and extend in the second direction; and forming gate conductive patterns by filling, with a conductive material, a region in which the sacrificial layers on the cell region are removed and the inside of the first tunnel and the second tunnels on the contact region.

15. The method of claim 14, further comprising:

forming a first insulating layer on the top of the cell stack structure;

bonding the first insulating layer to a second insulating layer covering a peripheral circuit layer;

removing the sacrificial substrate; and forming a plurality of gate contact structures connected to conductive pads of the peripheral circuit layer while penetrating the gate conductive patterns of the cell stack structure.

16. The method of claim 15, wherein each of the gate conductive patterns includes a first horizontal part and a second horizontal part, which are formed in the second tunnels, and a third horizontal part formed in the first tunnel, and wherein each of the plurality of gate contact structures is formed to extend vertically while penetrating the third horizontal part of each of the gate conductive patterns.

17. The method of claim 16, wherein each of the plurality of gate contact structures penetrates the sacrificial layers disposed above the third horizontal part.

18. The method of claim 17, wherein the sacrificial layers insulate the plurality of gate contact structures and the plurality of gate conductive patterns from each other.

19. The method of claim 16, wherein an extending length of the first horizontal part and the second horizontal part of each of the gate conductive patterns is longer than that of a gate conductive pattern disposed thereunder as sequential stacking of the gate conductive patterns increases in a vertical direction.

* * * * *